United States Patent
Tsai et al.

(10) Patent No.: US 9,627,522 B1
(45) Date of Patent: Apr. 18, 2017

(54) HIGH-ELECTRON-MOBILITY TRANSISTOR AND MANUFACTURING METHOD THEREOF

(71) Applicant: TAIWAN SEMICONDUCTOR MANUFACTURING COMPANY LTD., Hsinchu (TW)

(72) Inventors: Ming-Wei Tsai, Hsinchu County (TW); King-Yuen Wong, Hong Kong (CN); Chih-Wen Hsiung, Hsinchu (TW); Ming-Cheng Lin, Yilan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/935,342

(22) Filed: Nov. 6, 2015

(51) Int. Cl.
*H01L 29/778* (2006.01)
*H01L 29/40* (2006.01)
*H01L 29/66* (2006.01)

(52) U.S. Cl.
CPC .......... *H01L 29/778* (2013.01); *H01L 29/401* (2013.01); *H01L 29/402* (2013.01); *H01L 29/66431* (2013.01)

(58) Field of Classification Search
CPC ............. H01L 29/778; H01L 29/66431; H01L 29/401; H01L 29/402
See application file for complete search history.

(56) References Cited

U.S. PATENT DOCUMENTS

| | | | |
|---|---|---|---|
| 7,573,078 B2 | 8/2009 | Wu et al. | |
| 2014/0361342 A1 | 12/2014 | Sriram et al. | |
| 2015/0340483 A1* | 11/2015 | Briere | H01L 29/404 257/194 |

OTHER PUBLICATIONS

Office Action issued Apr. 18, 2016 on the Germany related application 10 2016 100 060.4.

* cited by examiner

*Primary Examiner* — Roy Potter
*Assistant Examiner* — Paul Patton
(74) *Attorney, Agent, or Firm* — WPAT, P.C., Intellectual Property Attorneys; Anthony King

(57) ABSTRACT

Some embodiments of the present disclosure provide a semiconductor device. The semiconductor device includes a semiconductive substrate. A donor-supply layer is over the semiconductive substrate. The donor-supply layer includes a top surface. A gate structure, a drain, and a source are over the donor-supply layer. A passivation layer covers conformally over the gate structure and the donor-supply layer. A gate electrode is over the gate structure. A field plate is disposed on the passivation layer between the gate electrode and the drain. The field plate includes a bottom edge. The gate electrode having a first edge in proximity to the field plate, the field plate comprising a second edge facing the first edge, a horizontal distance between the first edge and the second edge is in a range of from about 0.05 to about 0.5 micrometers.

20 Claims, 27 Drawing Sheets

HIGH-ELECTRON-MOBILITY TRANSISTOR AND MANUFACTURING METHOD THEREOF

FIELD

The present disclosure relates to a semiconductor device, especially for a high-electron-mobility transistor (HEMT).

BACKGROUND

A High-electron-mobility transistor (HEMT), also known as hetero-structure FET (HFET) or modulation-doped FET (MODFET) incorporates a junction between two materials with different band gaps (i.e. a heterojunction) as a channel instead of a doped region as in most of metal-oxide-semiconductor field-effect transistor (MOSFET).

HEMT transistors are capable of operating at high frequencies up to millimeter wave frequencies, and are used in high-frequency products. HEMT commonly uses material combination employing III-V compound semiconductors. Compound semiconductors such as gallium arsenide, aluminum gallium arsenide, gallium nitride, or aluminum gallium nitride can be used as the junction in the channel of the HEMT.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
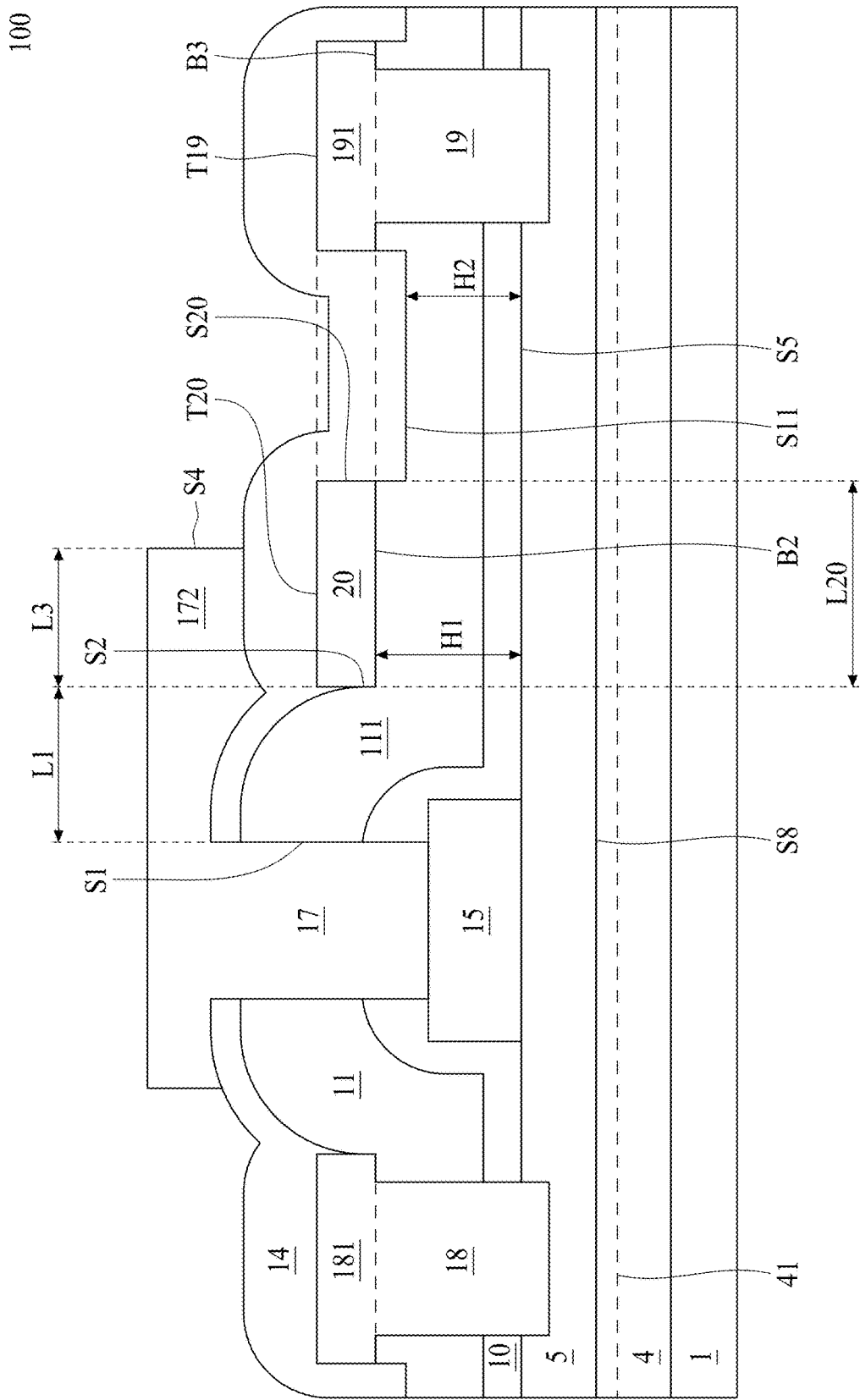
FIG. 1 is a cross-sectional view of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gallium nitride HEMTs on silicon substrates are used as power switching transistors for voltage converter applications. Compared to silicon power transistors, gallium nitride HEMTs feature low on-state resistances, and low switching losses due to wide bandgap properties.

Enhancement-mode aluminum gallium nitride/gallium nitride high electron mobility transistors (E-HEMTs) are used in power circuit applications. The E-HEMT includes a field plate design to modulate electric fields in a channel.

High voltages in a junction between the channel and drift region lead to low breakdown voltages. Electric field in the junction can be reduced by incorporating a very low doping in the drift region. Since this increases the resistance, other solutions such as decreasing a peak of the electric field is used. The solution is also known as reduced surface field (RESURF) technique. The RESURF technique can use a field plate structure to lower a capacitance between gate-to-drain (Cgd) and to increase power efficiency. The RESURF technique can influence figure of merit (FOM) of a power device. The field plate modulates the electric field between the gate and the drain such that a depletion profile is reduced and a device speed is increased.

Bring the field plate closer to the gate and the channel reduces the electric field near the gate and lowers the Cgd. In some embodiments, as shown in FIG. 1, field plate 20 is disposed under capping layer 14 instead of over the capping layer 14 such that field plate 20 is disposed closer to the channel. The channel can be in channel layer 4. Capping layer 14 protects field plate 20 by completely covering over field plate 20.

FIG. 1 illustrates a semiconductive device 100 for high voltage application. Semiconductive device 100 can be a high electron mobility transistor (HEMT) including a semiconductive substrate 1, a channel layer 4, a donor-supply layer 5, a gate structure 15, a gate protection layer 10, a passivation layer 11, a gate electrode 17, a source 18, a source contact 181, a drain 19, a drain contact 191, the field plate 20, and the capping layer 14.

The donor-supply layer 5 includes a top surface S5. The gate structure 15 is on the top surface S5 of the donor-supply layer 5. The drain 19 and the source 18 are over the donor-supply layer 5. In some embodiments, the drain 19 or the source 18 is partially buried in the donor-supply layer 5. The gate protection layer 10 is over the gate structure 15 and the donor-supply layer 5. The passivation layer 11 is also over the gate structure 15 and the donor-supply layer 5 following a contour of the gate protection layer 10. The drain 19 or the source 18 penetrates through the passivation layer 11 and the gate protection layer 10 to reach the donor-supply layer 5. The source contact 181 is over the source 18. The drain contact 191 is over the drain 19. A bottom surface B3 of the source contact 181 or the drain contact 191 is substantially coplanar with the bottom edge B2 of the field plate 20. Gate electrode 17 is over the gate structure 15.

In some embodiments, the field plate 20 is disposed on the passivation layer 11, and is located between the gate structure 15 and the drain 19. Gate electrode 17 includes a first edge S1 in proximity to the field plate 20. The field plate 20 includes a second edge S2 and a bottom edge B2. The second edge S2 faces the first edge S1. The bottom edge B2 faces the donor-supply layer 5. A horizontal distance L1 between the first edge S1 and the second edge S2 is in a range of from about 0.05 to about 0.5 micrometers. The field plate 20 is to be near first edge S1 of gate electrode 17 to reduce the electric field near the first edge S1 of gate electrode 17. However, the horizontal distance L1 is designed to be in a range of from about 0.05 to about 0.5 micrometers such that a sufficient thickness shown as a portion 111 of passivation layer 11 between first edge S1 and second S2 remains after an etching operation defining the source contact 181 and the drain contact 191. In some embodiments, the etching operations can be for removing a top portion of passivation layer 11 as to over-etch the source contact 181 and the drain contact 191. The portion 111 of passivation layer 11 prevents electrical shorting between the field plate 20 and gate electrode 17.

A vertical distance H1 between the bottom edge B2 and the top surface S5 is around 100 angstroms. The field plate 20 is to be near top surface S5 of donor-supply layer 5 to reduce the electric field under the field plate 20. Field plate 20 includes a length L20 from second edge S2 to a far edge S20 opposite to the second edge S2. Bringing field plate 20 closer to top surface S5 reduces more electric field under the field plate 20. Vertical distance H1 is designed to be around 100 angstroms to prevent over-etching of passivation layer 11 from exposing underlying protection layer 10 or donor-supply layer 5. However, in some embodiments, the vertical distance H1 can be thicker than about 100 angstroms since the aforesaid over-etching can be prevented when a thicker vertical distance H1 is applied. The protection layer 10 includes a thickness in a range of from around 5 to 500 angstroms. Vertical distance H1 is at least greater than the thickness of protection layer 10. In some embodiments, vertical distance H1 is smaller than horizontal distance L1 since the etching operation, such as an anisotropic etch, is preferred to remove more horizontal portions than vertical portions of the passivation layer 11. The vertical portion is the portion 111 immediately surrounding the gate electrode 17. The horizontal portion is the portion parallel to top surface S5.

The capping layer 14 is over the field plate 20, source contact 181, drain contact 191, or gate structure 15. The gate electrode 17 includes a horizontal portion 172 over the field plate 20. Horizontal portion 172 is partially covering over capping layer 14. The horizontal portion 172 includes a far edge S4 extending over the field plate 20. In some embodiments, horizontal portion 172 overlaps with the field plate 20 by a length L3 in a range of from about 0.05 to about 0.5 micrometers such that horizontal portion 172 fully covers over the portion 111 of the passivation layer 11 to protect an insulation region from subsequent manufacturing operation such as etching.

Semiconductive device 100 includes a number of layers over semiconductive substrate 1. Some layers are epitaxy layers. The layers include an optional nucleation layer of aluminum nitride layer, an optional buffer layer of aluminum gallium nitride, and a bulk gallium nitride layer such as channel layer 4. The channel layer 4 may be over a buffer layers or directly on semiconductive substrate 1.

An active layer such as donor-supply layer 5 is on top of the channel layer 4. An interface S8 is defined between the channel layer 4 and the donor-supply layer 5. A carrier channel 41 of two-dimensional electron gas (2-DEG) is located in proximity to the interface S8. In some embodiments, the donor-supply layer 5 is an aluminum gallium nitride (AlGaN) layer. The donor-supply layer 5 has a formula of $Al_xGa_{(1-x)}N$, wherein x varies between about 10% and 100%. It has a thickness in a range from about 5 nanometers to about 50 nanometers. In other embodiments, the donor-supply layer 5 may include an AlGaAs layer, or AlInP layer.

A band gap discontinuity exists between the donor-supply layer 5 and the channel layer 4. The electrons from a piezoelectric effect in the donor-supply layer 5 drop into the channel layer 4, creating a very thin layer of highly mobile conducting electrons in the channel layer 4. This thin layer is referred to as a two-dimensional electron gas (2-DEG), forming a carrier channel 41. The thin layer of 2-DEG is located near interface S8 of the donor-supply layer 5 and the channel layer 4. Thus, the carrier channel 41 has high electron mobility because the channel layer 4 is undoped or unintentionally doped, and electrons can move freely without collision or substantially reduced collision with impurities.

The source 18 and the drain 19 are disposed on the donor-supply layer 5 to electrically connect to the carrier channel 41. The source 18 and the drain 19 include a corresponding intermetallic compound. In some embodiments, the intermetallic compound is embedded in the donor-supply layer 5 and may be further embedded in a top portion of the channel layer 4. In some embodiments, the intermetallic compound includes Al, Ti, or Cu. In some other embodiments, the intermetallic compound includes AN, TiN, $Al_3Ti$ or AlTiN.

Gate structure 15 is disposed on the donor-supply layer 5, and is located between the source 18 and the field plate 20. The gate structure 15 may include one or many layers. The gate structure 15 includes a semiconductive material such as gallium nitride with negative or positive dopants.

A conductive material in the gate electrode 17 is for voltage bias and electrical coupling with the carrier channel 41. In some embodiments, the conductive material may include a refractory metal or its compounds, e.g., tungsten (W), titanium nitride (TiN) and tantalum (Ta). Other commonly used metals in the conductive material include nickel (Ni) and gold (Au).

Passivation layer 11 covers a drift region of the donor-supply layer 5 between the gate structure 15 and drain 19. A portion of the passivation layer 11 under the field plate 20 has a relatively constant height such as vertical distance H1.

The field plate 20 includes a far edge S20 opposite to the second edge S2. A portion of the passivation layer 11 between the far edge S20 and the drain 19 includes another constant height such as vertical distance H2. In some embodiments, vertical distance H1 is greater than vertical distance H2 by around 100 to 200 angstroms. A height of the passivation layer 11 under field plate 20 and under an overhang portion of the drain contact 191 can be the same at around the vertical distance H1. Top surface S11 of passivation layer 11 is lower than bottom edge B2 or bottom surface B3. Thicknesses of the field plate 20 and the drain contact 191 are substantially the same such that a top surface T20 of the field plate 20 and a top surface T19 of the drain contact 191 are substantially positioned at a same height level.

In some embodiments, the source 18, the drain 19, the source contact 181, or the drain contact 191 include an identical material as the field plate 20. The material can be an ohmic metal.

The passivation layer 11 includes material such as silicon oxide ($SiO_x$), silicon nitride ($SiN_x$), silicon oxynitride, carbon doped silicon oxide, carbon doped silicon nitride, carbon doped silicon oxynitride, zinc oxide, zirconium oxide, hafnium oxide or titanium oxide. A thickness of the passivation layer 11 is in a range of from around 50 nanometers to around 500 nanometers. By reducing the thickness of the passivation layer 11, vertical distance H1 and horizontal distance L1 can be reduced. Reducing vertical distance H1 and horizontal distance L1 brings field plates 20 closer to the first edge S1 of the gate electrode 17 and closer to the top surface S5 of the donor-supply layer 5. This increases effectiveness of the RESURF region, consequently, lowering a capacitance between gate-to-drain (Cgd) and increasing power efficiency of the HEMT.

Figure 2:
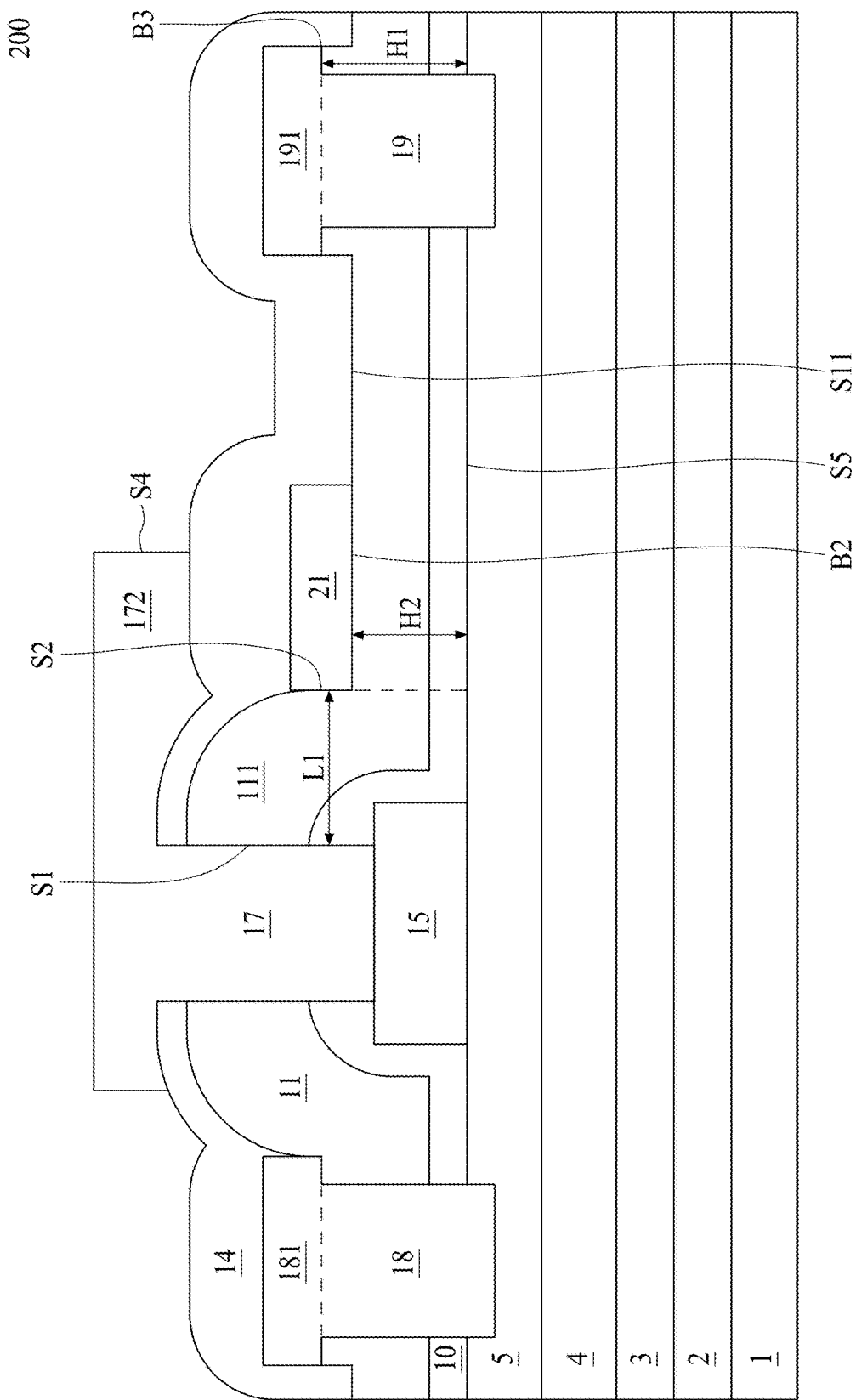
FIG. 2 is a cross-sectional view of a semiconductor device, in accordance with some embodiments of the present disclosure.

FIG. 2 illustrates a semiconductive device 200 for high power application. Semiconductive device 200 is similar to semiconductive device 100 in FIG. 1, except that a field plate 21 includes a material different from that of source contact 181, drain contact 191, source 18, or drain 19. A bottom edge B2 of field plate 21 is substantially coplanar with the top surface S11 of the passivation layer 11. Bottom edge B2 is lower than bottom surface B3 of the drain contact 191 by a range from around 100 to 200 angstroms. In some embodiments, buffer layer 2 or buffer layer 3 is disposed between semiconductive substrate 1 and channel layer 4.

Figure 3:
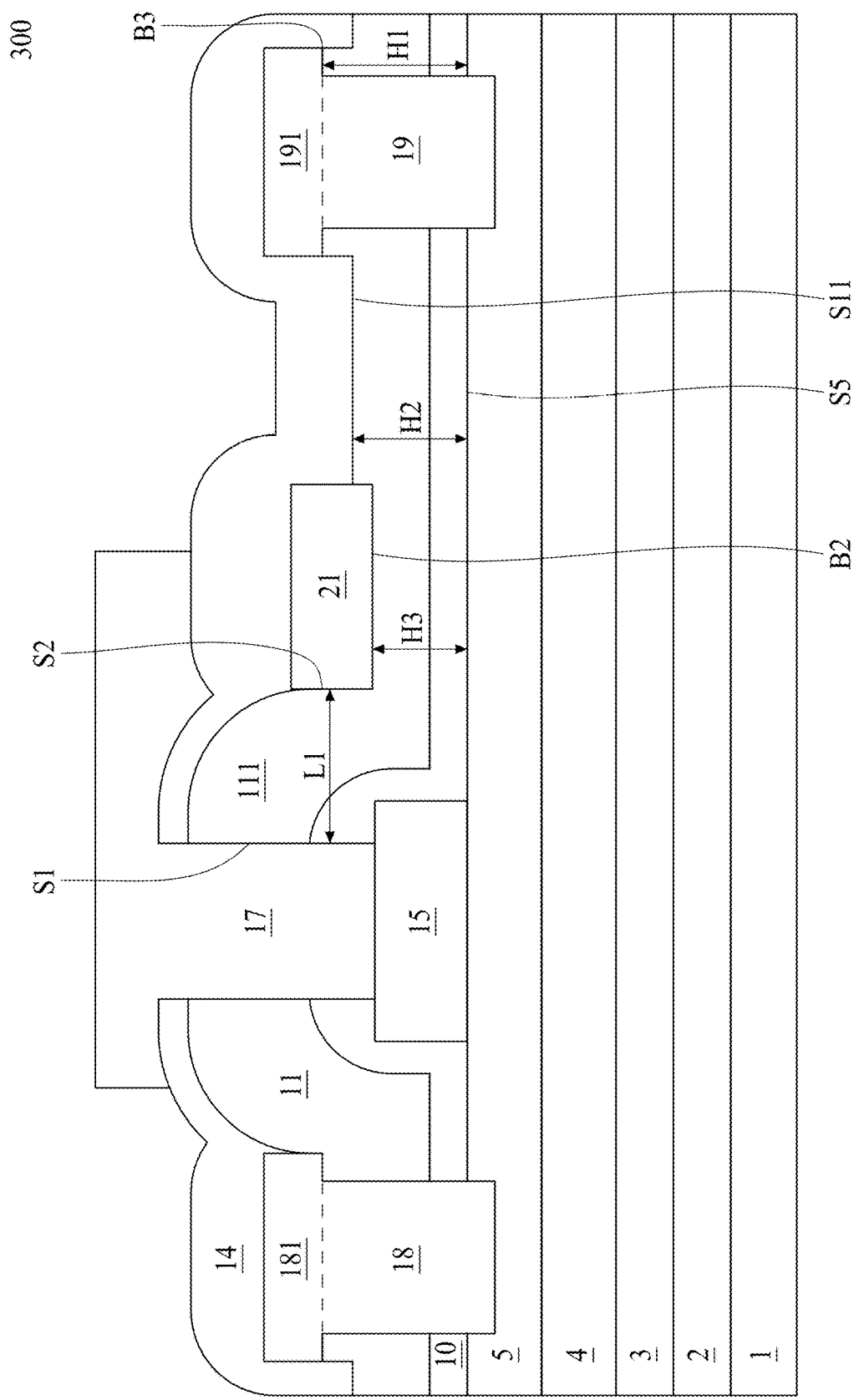
FIG. 3 is a cross-sectional view of a semiconductor device, in accordance with some embodiments of the present disclosure.

FIG. 3 illustrates semiconductive device 300 as another power transistor. Semiconductive device 300 is similar to semiconductive device 200 in FIG. 2, except that bottom edge B2 of field plate 21 is lower than the top surface S11 of the passivation layer 11. Field plate 21 is over the top surface S5 of the donor-supply layer 5 by a vertical distance H3. In some embodiments, vertical distance H1 is greater than vertical distance H2. Vertical distance H2 is greater than vertical distance H3. The field plate 20 or 21 in proximity to a gate edge such as first edge S1 reduces a maximum surface electric field at the gate edge.

Figure 4:
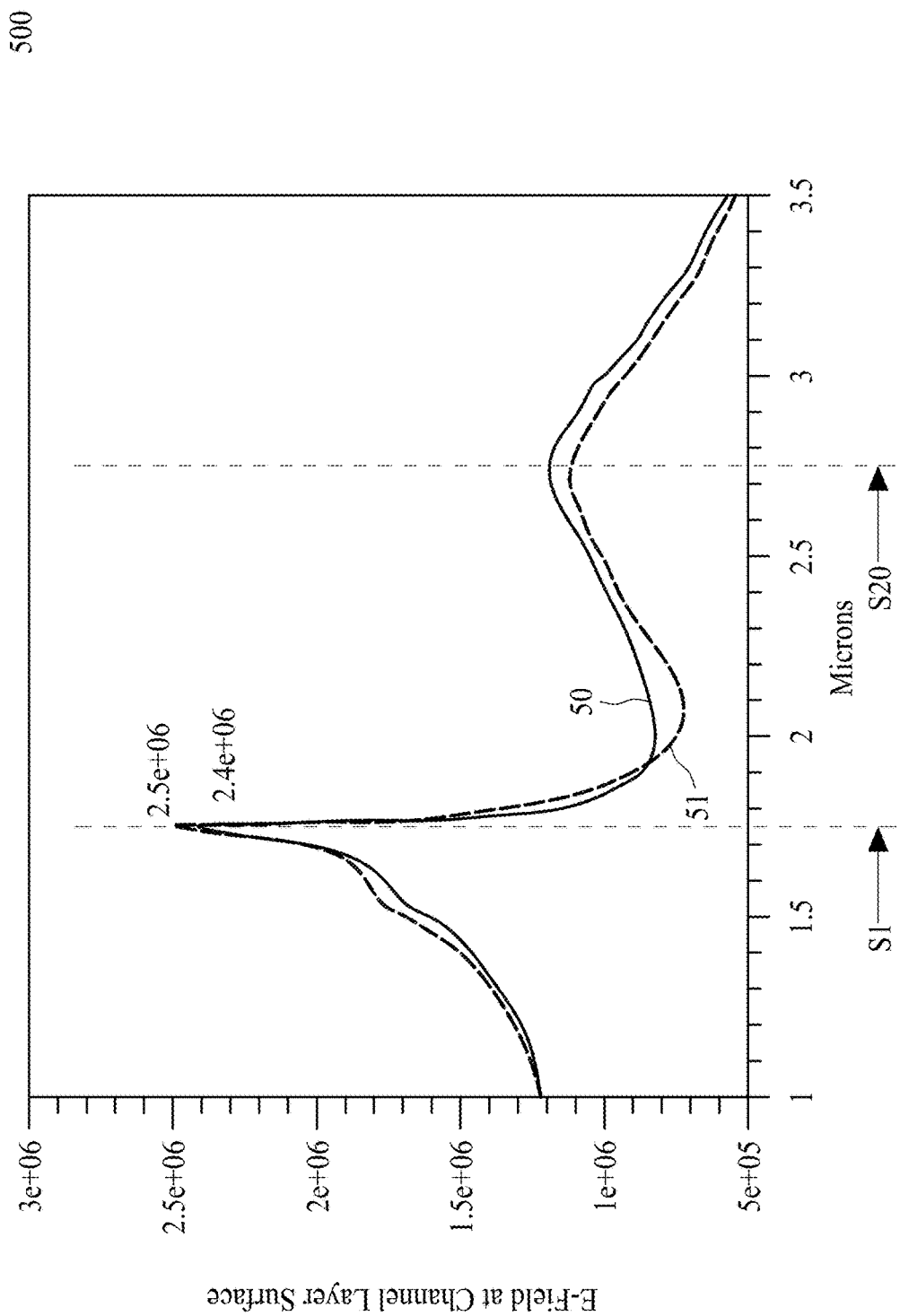
FIG. 4 is a diagram illustrating field strength of a semiconductor device, in accordance with some embodiments of the present disclosure.

FIG. 4 includes diagram 500 illustrating field strength of a semiconductor device, in accordance with some embodiments of the present disclosure. A horizontal axis of the diagram 500 represents a location on interface S8 of channel layer 4. For example, the gate edge (or refer to the first edge S1 of the gate electrode 17 in FIG. 1) is over the position of interface S8 at around 1.7 micrometers. The field plate edge (or refer to the far edge S20 of the field plate 20 in FIG. 1) is over the position of interface S8 at around 2.7 micrometers. A vertical axis of the diagram 500 represents magnitude of electrical field strength at interface S8. A solid line S1 represents electrical field strength by using a field plate in some embodiments of the present disclosure. A dash-line 50 represents electrical field strength by using a field plate in other conventional setting such as disposing a field plate over a passivation layer. At around the gate edge (i.e., first edge S1), dash-line 50 reaches a peak height at around 2.5E6, whereas solid line S1 reaches a peak height at around 2.4E6. The field plate in the present disclosure lowers the peak height of electrical field strength near the gate edge (i.e., first edge S1).

Figure 5:
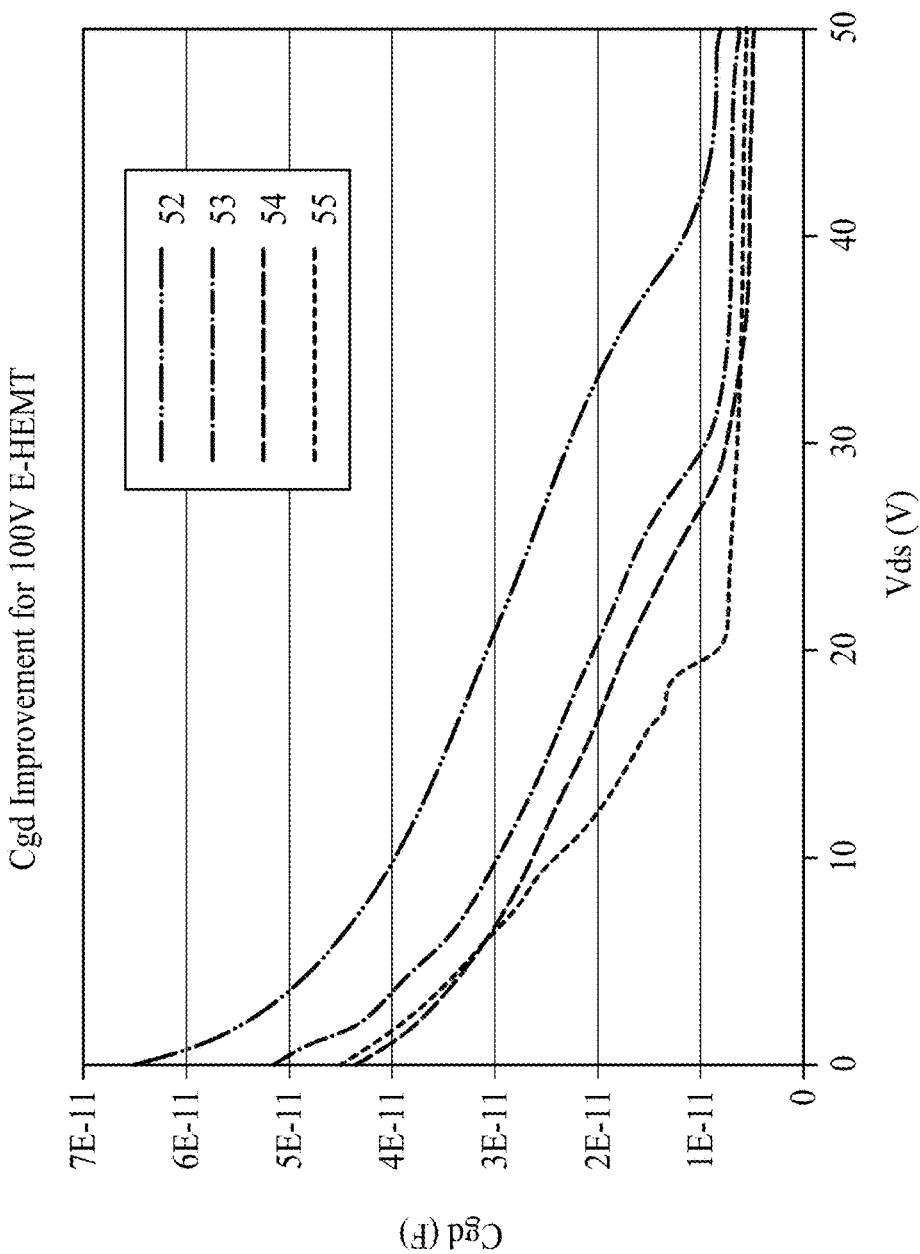
FIG. 5 is a diagram illustrating a gate-to-drain capacitance against an applied drain-to-source voltage of a semiconductor device, in accordance with some embodiments of the present disclosure.

FIG. 5 is a diagram 501 illustrating a gate-to-drain capacitance against an applied drain-to-source voltage of a semiconductor device, in accordance with some embodiments of the present disclosure. When a voltage Vds is apply between a drain and a source, the gate-to-drain capacitance varies differently for different field plate structure.

Curve 52 represents the gate-to-drain capacitance of a semiconductive device using a field plate structure in a conventional setting. Curve 53 represents the gate-to-drain capacitance of a semiconductive device using a first field plate in some embodiments of the present disclosure. Curve 54 represents the gate-to-drain capacitance of a semiconductive device using a second field plate in some embodiments of the present disclosure. For example, only 75% of the passivation thickness compared to that under the first field plate is separating the second field plate and the channel. Curve 55 represents the gate-to-drain capacitance of a semiconductive device using a third field plate in some embodiments of the present disclosure. For example, only 50% of the passivation thickness compared to that under the first field plate is separating the third field plate and the channel. For Vds at around 20 volts, the gate-to-drain capacitance is the lowest for curve 55, representing achieving depletion at a comparatively lower Vds. Reducing the distance between the field plate and the channel lowers the gate-to-drain capacitance at a predetermined Vds. Also the integrated area under curve 55 is the smallest among those under curves 52-54. As such, device using the field plate taught in the present disclosure can achieve a greater switching speed.

Figure 6:
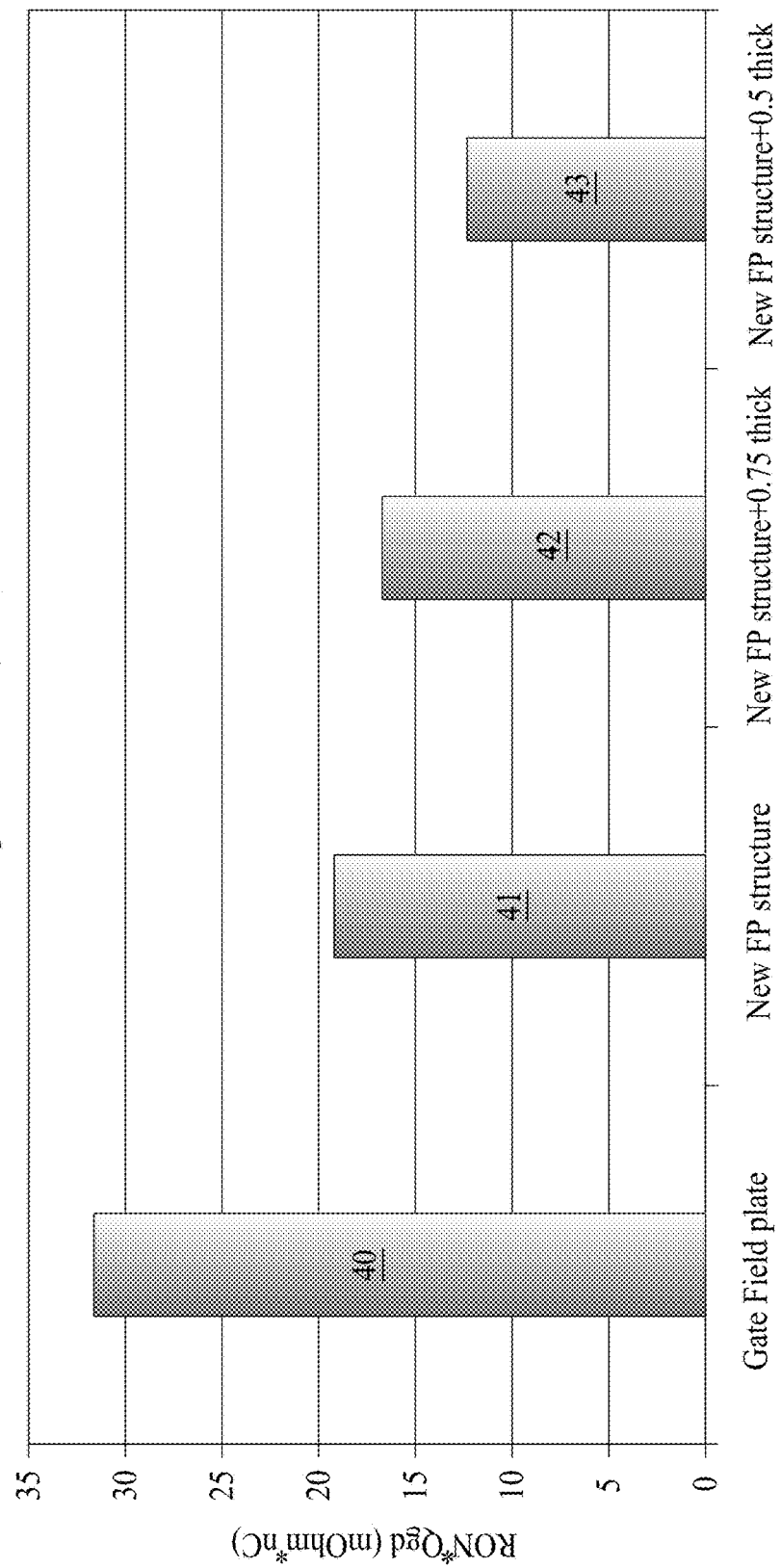
FIG. 6 is a diagram illustrating figure of merit of a semiconductor device, in accordance with some embodiments of the present disclosure.

FIG. 6 is a diagram 502 illustrating a figure of merit of a semiconductor device, in accordance with some embodiments of the present disclosure. The figure of merit is a quantity used to characterize a performance of a semiconductor device. In FIG. 6, the figure of merit includes a product of quantities of on-resistances Ron and gate-to-drain charge Qgd. A low on-resistance represents low conduction losses. A low gate-to-drain charge indicating low switching loss. The product of the Ron and Qgd is commonly used for quantifying a device performance. A smaller product indicating better switching performance. The diagram 502 illustrates the product of the Ron and Qgd for different field plate structures. Column 40 represents the field plate structure of a conventional setting. Column 41 represents the product for the first field plate as addressed in FIG. 5. Column 42 represents the product for the second field plate as addressed in FIG. 5. Column 43 represents the product for the third field plate as addressed in FIG. 5. Reducing the separation between the channel and the field plate increases the switching performance.

Figure 7:
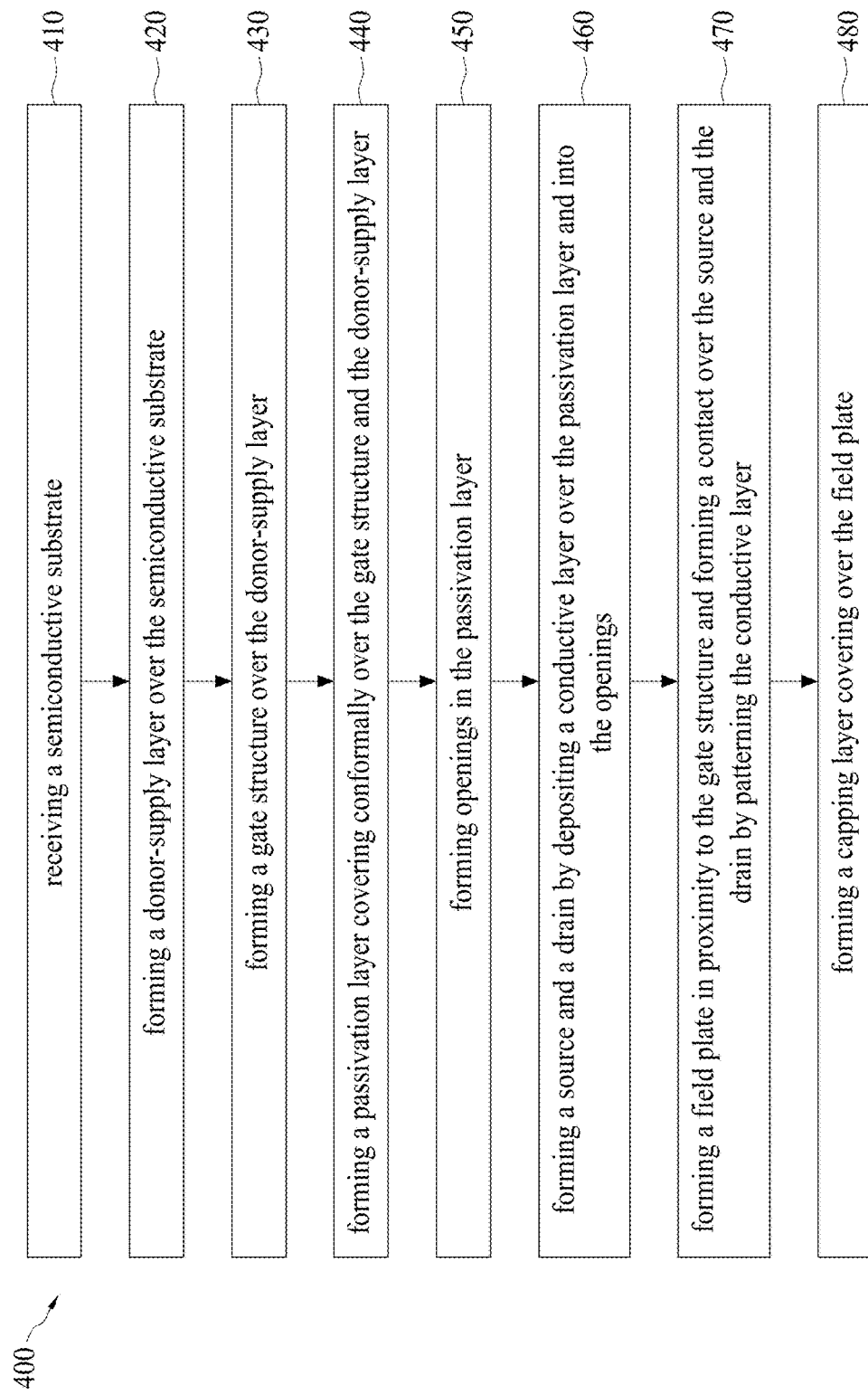
FIG. 7 is an operational flow of a method for manufacturing a semiconductor device, in accordance with some embodiments.
Figure 8:
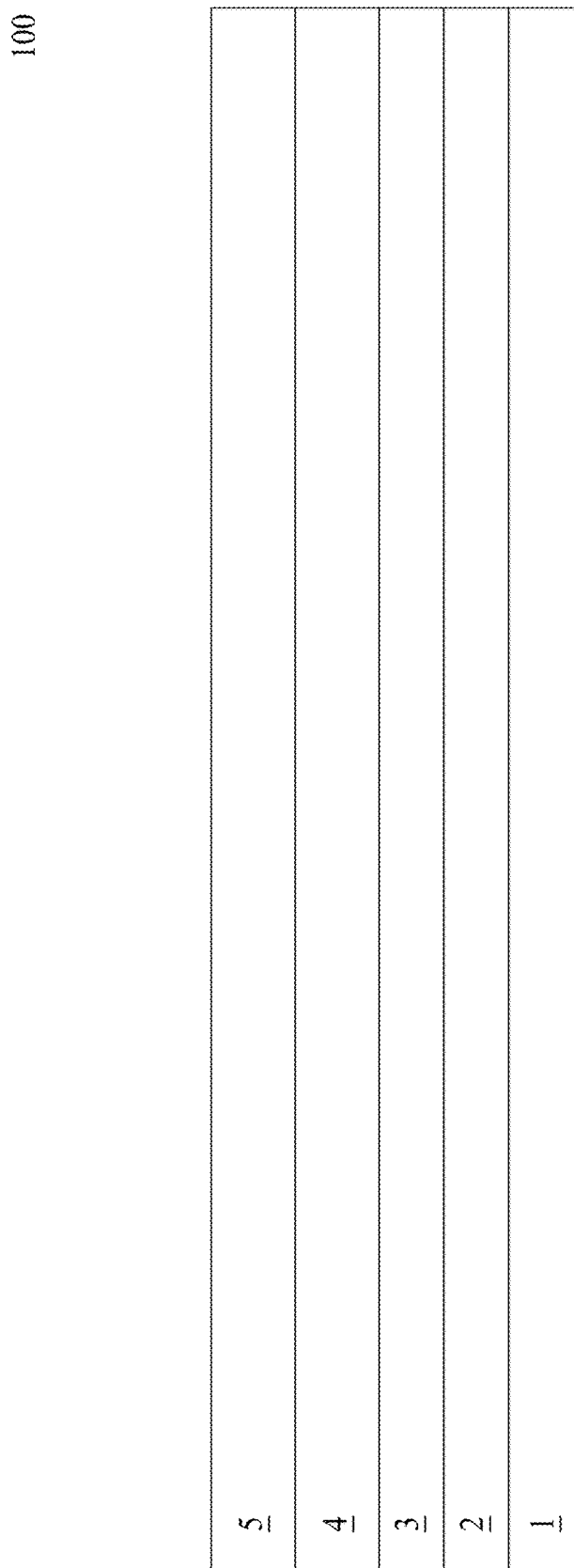
FIGS. 8 to 17 are fragmental cross-sectional views during operations of a method for manufacturing a semiconductor device, in accordance with some embodiments.
Figure 9:
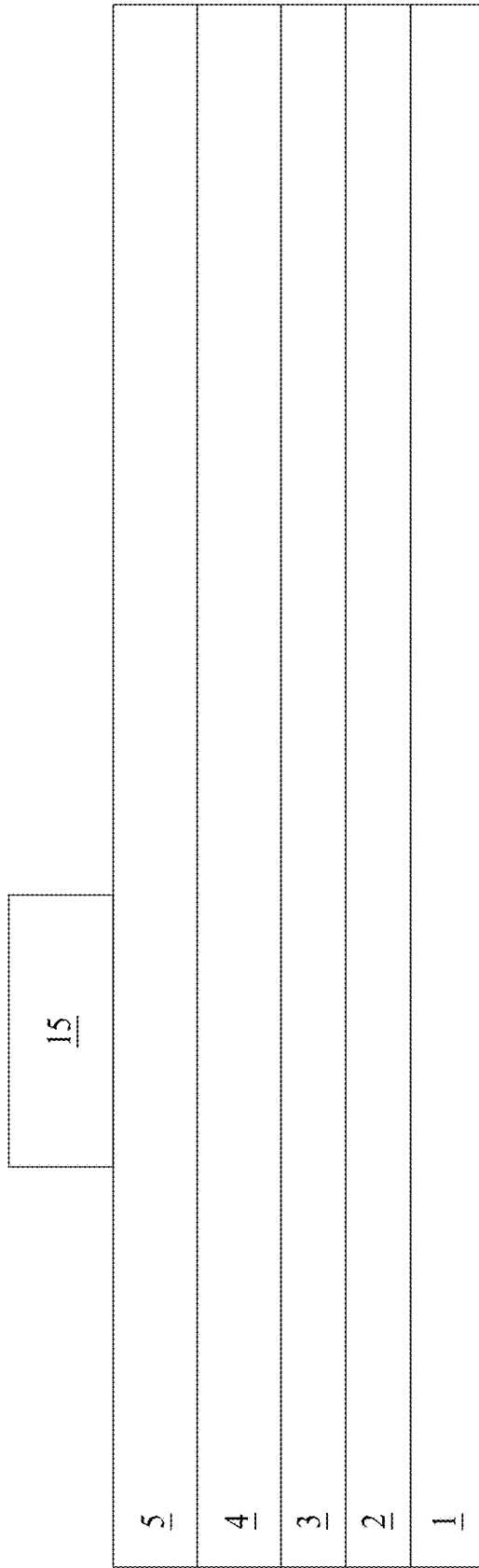
Figure 11:
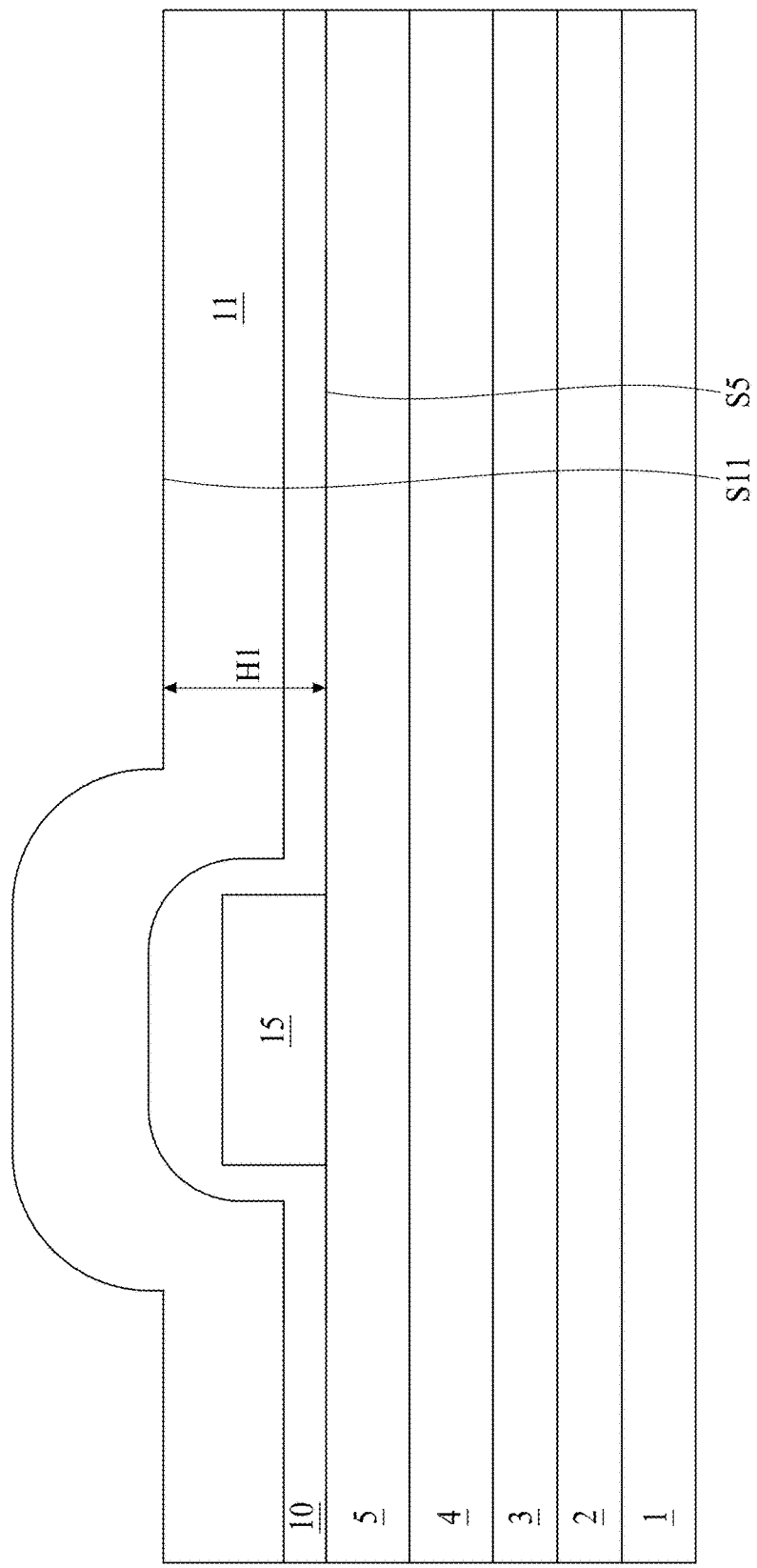
Figure 12A:
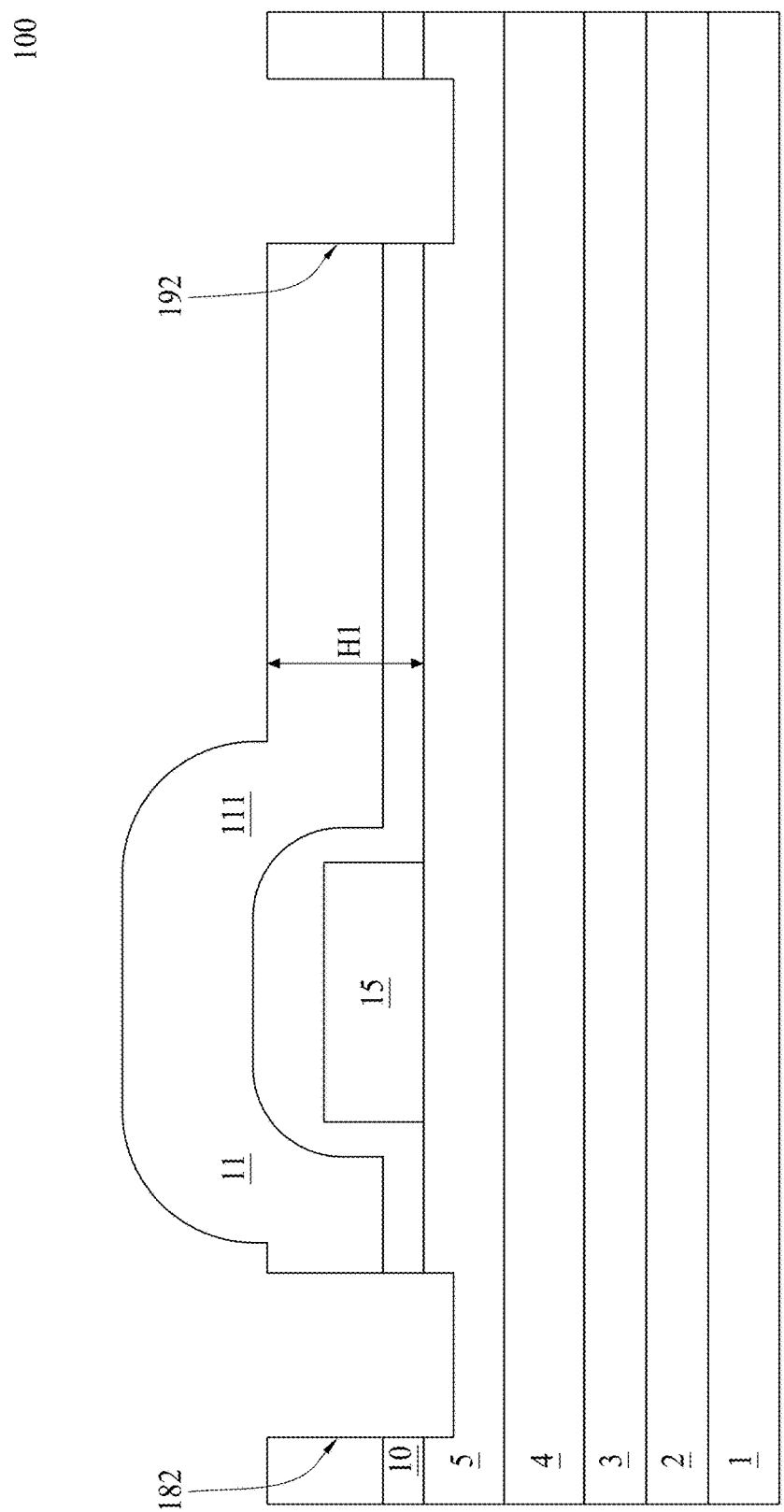
Figure 12B:
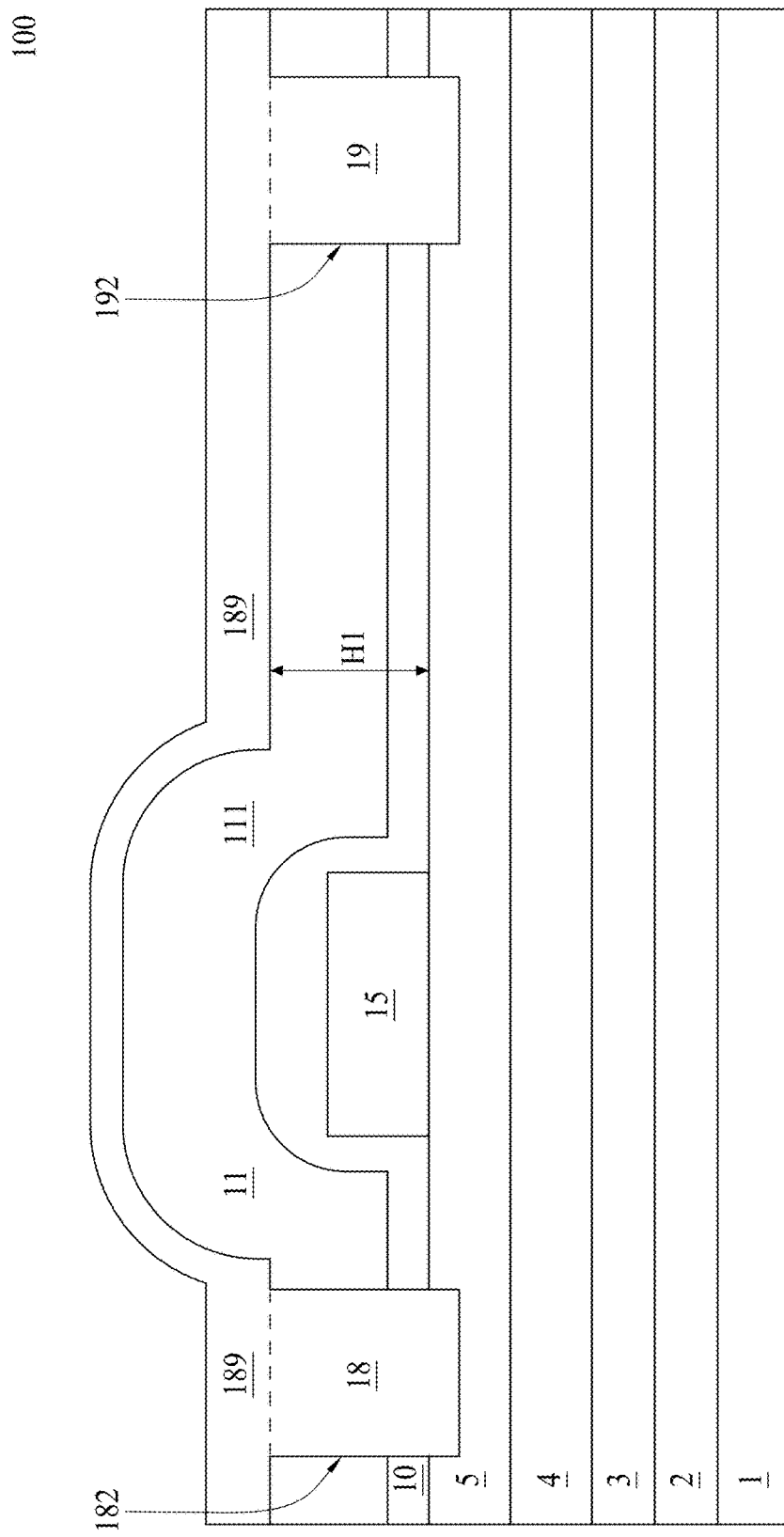
Figure 14:
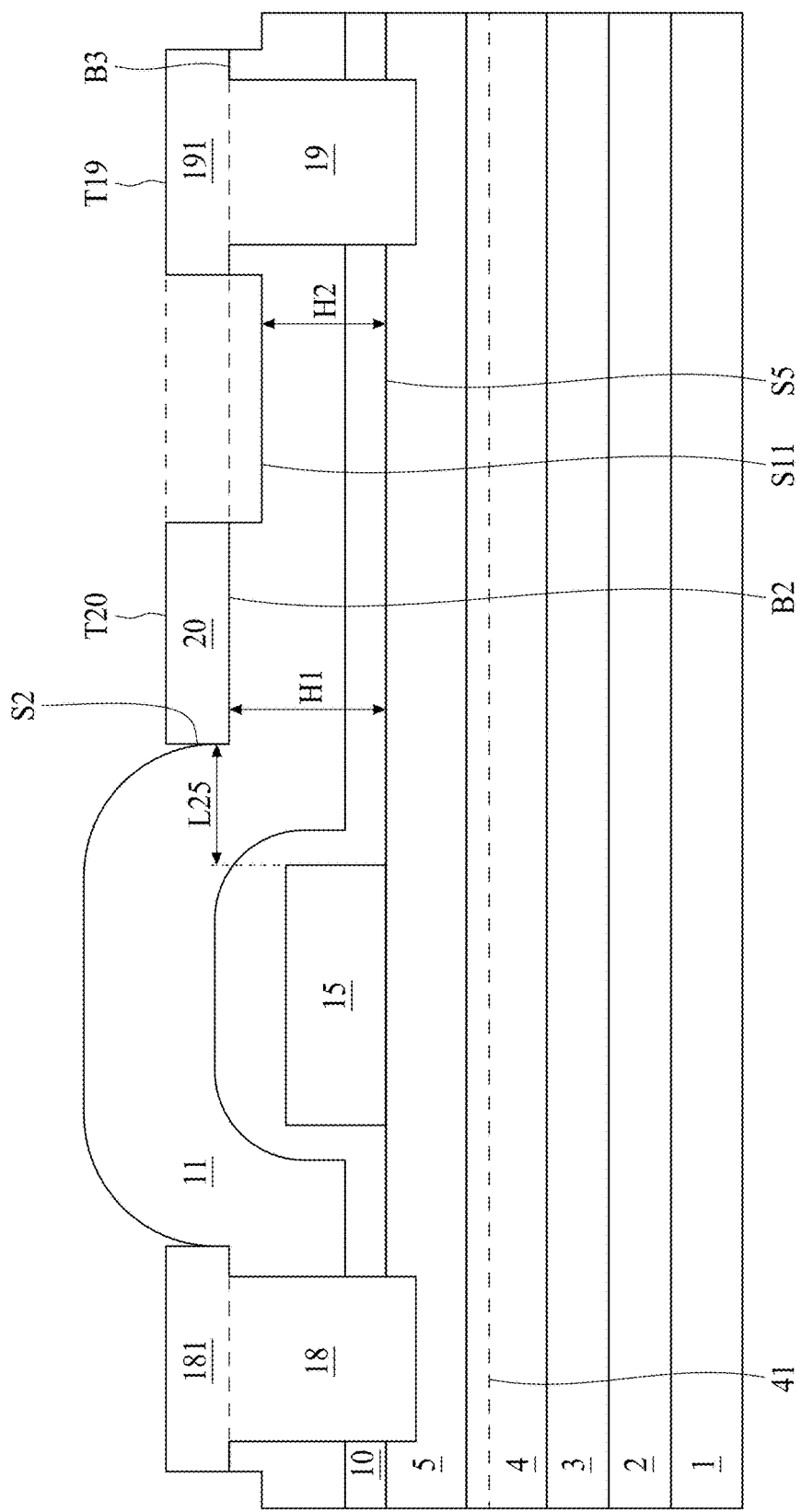
Figure 15:
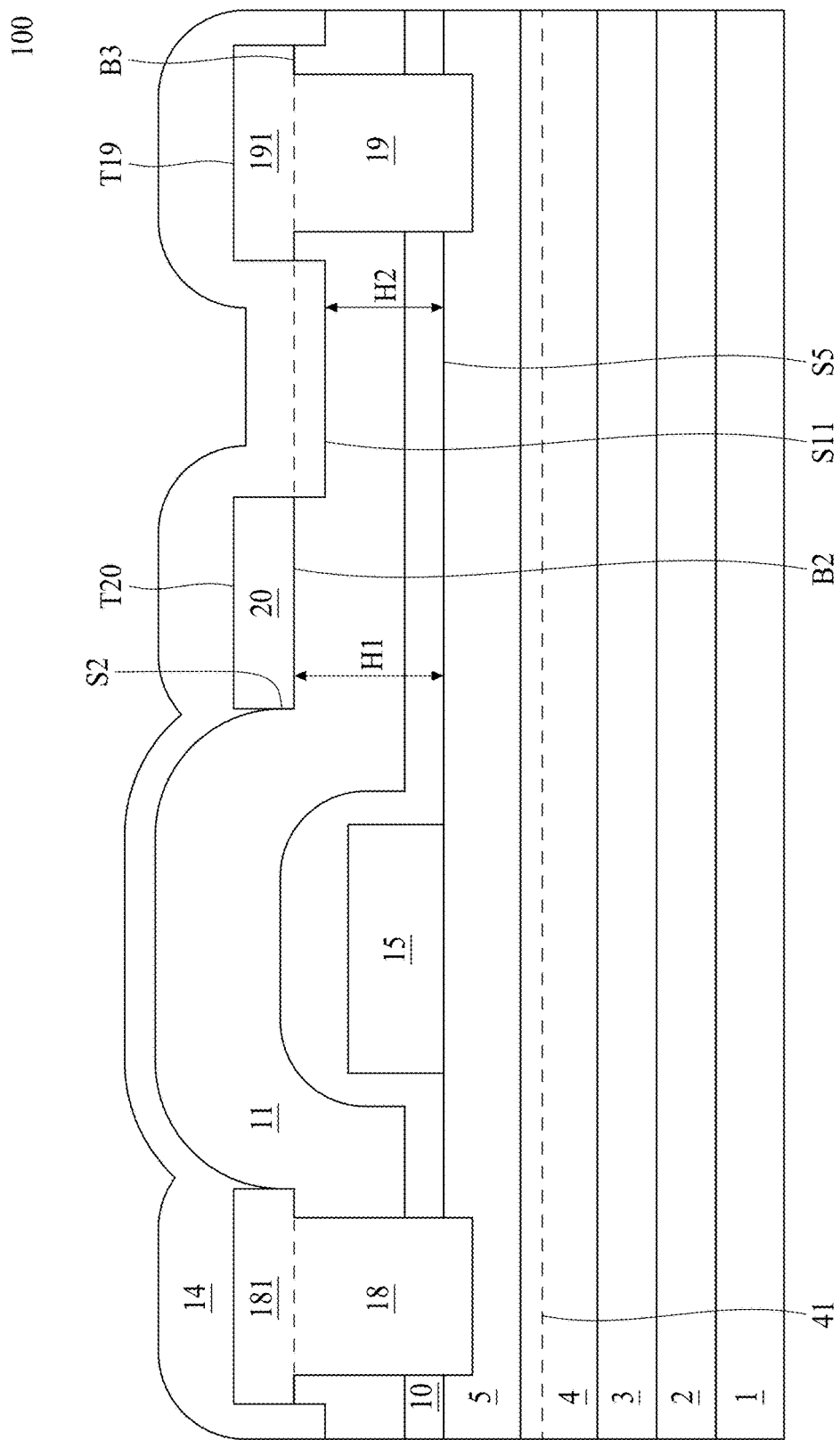

In FIG. 7, a method of manufacturing 400 is illustrated. FIG. 7 illustrates a process flow for forming the semiconductive device 100 in FIG. 1. Operation 410 receives a semiconductive substrate 1. Some exemplary embodiments for operation 410 are illustrated in FIG. 8. Operation 420 forms a donor-supply layer 5 over the semiconductive substrate 1. Some exemplary embodiments for operation 420 are illustrated in FIG. 8. Operation 430 forms a gate structure 15 over the donor-supply layer 5. Some exemplary embodiments for operation 430 are illustrated in FIG. 9. Operation 440 forms a passivation layer 11 over the gate structure 15 and the donor-supply layer 5. Some exemplary embodiments for operation 440 are illustrated in FIG. 11. Operation 450 forms openings 192 and 182 in the passivation layer 11. Some exemplary embodiments for operation 450 are illustrated in FIG. 12A. Operation 460 forms a source 18 and a drain 19 by depositing a conductive layer 189 over the passivation layer 11 and into the openings 192 and 182. Some exemplary embodiments for operation 460 are illustrated in FIG. 12B. Operation 470 forms a field plate 20 in proximity to a gate structure 15 and forming a contact 181, 191 over the source 18 and the drain 19 by patterning the conductive layer 189. Some exemplary embodiments for operation 470 are illustrated in FIG. 14. Operation 480 forms a capping layer 14 covering over the field plate 20. Some exemplary embodiments for operation 480 are illustrated in FIG. 15.

In FIG. 8, semiconductive substrate 1 is received. Channel layer 4 and donor-supply layer 5 are formed stacking over the semiconductive substrate 1. In some embodiments, buffer layers 2 and 3, channel layer 4, or donor-supply layer 5 is formed epitaxially.

In FIG. 9, a doped semiconductive layer such as gallium nitride is formed including a positive or negative dopant. The doped semiconductive layer is patterned by any suitable method such as lithographic to form gate structure 15.

Figure 10:
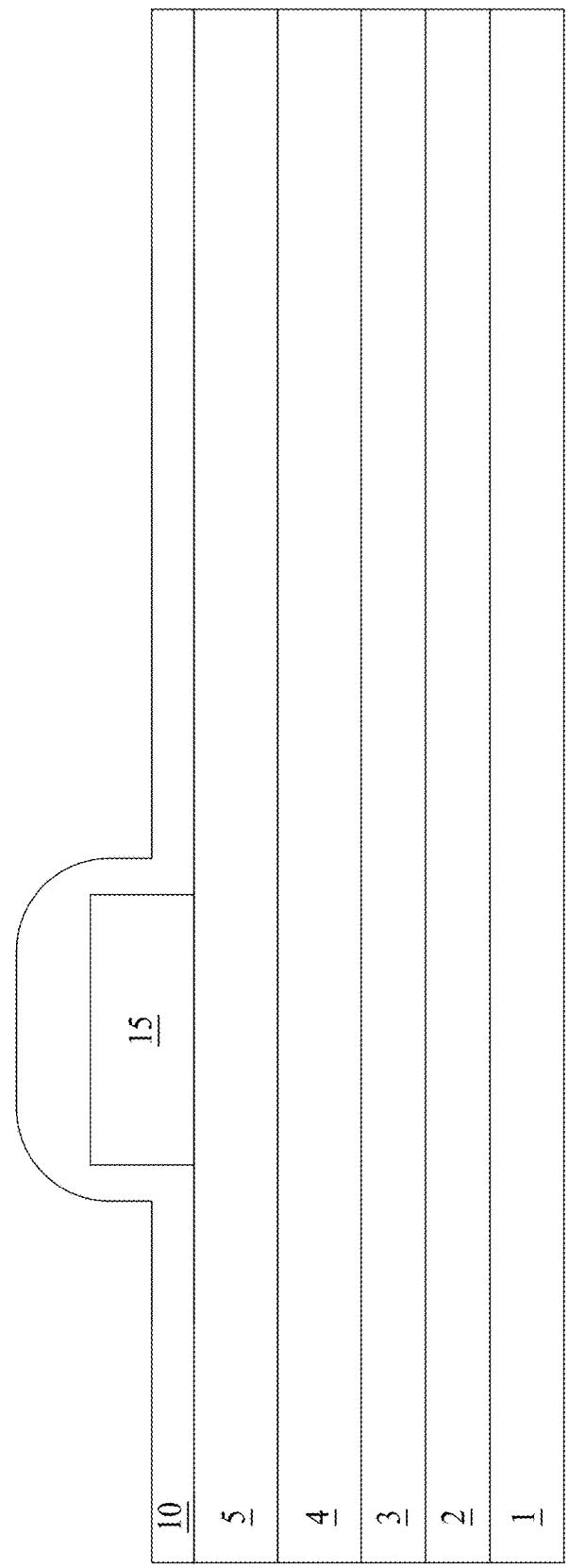

In FIG. 10, gate protection layer 10 is formed conformally over gate structure 15 and donor-supply layer 5. Gate protection layer 10 is form by any suitable deposition operation such as chemical vapor deposition (CVD), physical vapor deposition (PVD), atomic layer deposition (ALD), high density plasma CVD (HDPCVD), remote plasma CVD (RPCVD), plasma enhanced CVD (PECVD), or low-pressure chemical vapor deposition (LPCVD) to deposit material such as aluminum nitride (AlN) or aluminum oxide ($Al_2O_3$).

In FIG. 11, passivation layer 11 is formed by any suitable deposition operation over the gate protection layer 10. Passivation layer 11 is formed including a thickness in a range of from around 50 to around 500 nanometers to prevent gate protection layer 10 from being damaged by subsequent operation such as over-etching of passivation layer 11. The thickness is to be sufficiently small such that field plate 20 in FIG. 1 on top of passivation layer 11 is close to top surface S5 of donor-supply layer 5 by the height H1. Height H1 is controlled by the thickness of passivation layer 11.

In FIG. 12A, openings 182 and 192 are formed by any suitable operation such as etching. In some embodiments, the etching stops on a top portion of donor-supply layer 5. In some embodiments, the top portion of donor-supply layer 5 is removed.

In FIG. 12B, conductive layer 189 covers over passivation layer 11 and fills in the openings 182 and 192 to form source 18 and drain 19. In some embodiments, conductive layer 189 is an ohmic metal formed by any suitable deposition. In some embodiments, a top surface of conductive layer 189 is uniformly flat over drain 19 and extends to portion 111 of passivation layer 11. The portion 111 of passivation layer 11 is between first edge S1 of gate electrode 17 and second edge S2 of field plate 20 as shown in FIG. 1.

Figure 13:
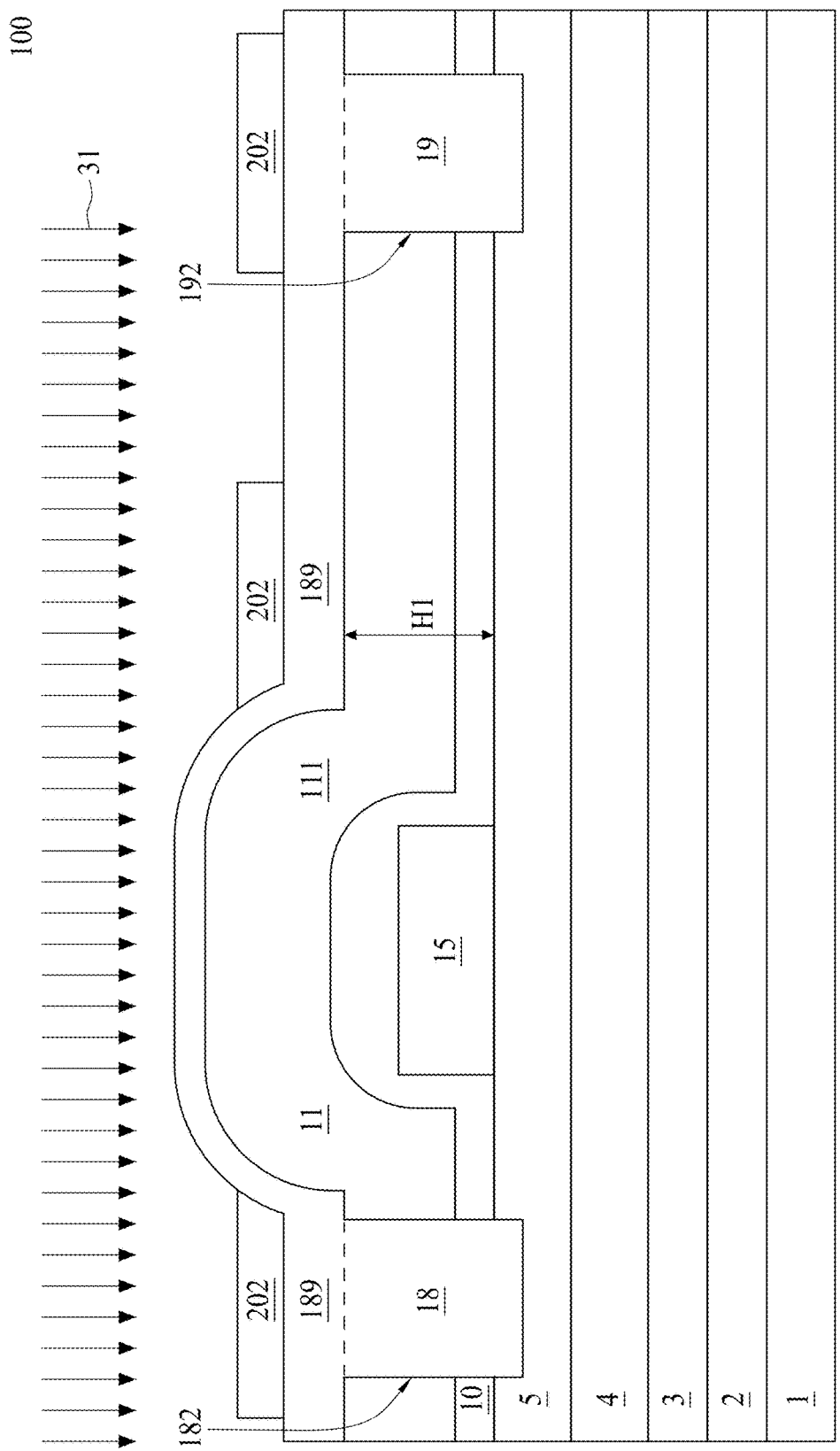

In FIG. 13, resist or hard mask 202 is patterned to cover over source 18 and drain 19 to protect portions of conductive layer 189 over source 18 and drain 19 from etching operation 31. Portions of conductive layer 189 over source 18 forms source contact 181 in FIG. 14. Portions of conductive layer 189 over drain 19 forms drain contact 191. In some embodiments, the etching operation 31 is anisotropic etch such as dry etch. Resist or hard mask 202 also protect another portion of conductive layer 189 near gate structure 15 to form field plate 20 in FIG. 14. Other portions of conductive layer 189 exposed to etchants of the etching operation 31 in FIG. 13 are removed. The etching operation 31 includes dry etching, reactive ion etching, purely chemical (plasma etching), and/or combinations thereof.

In FIG. 14, a portion of the top surface S11 of passivation layer 11 is lowered by around 100 to around 200 angstroms by reducing the thickness of the passivation layer 11 due to over-etching. The over-etching serves to make sure a thorough removal of a portion of conductive layer 189 between field plate 20 and drain contact 191 such that electrical shorting is prevented between the field plate 20 and the drain contact 191. In some embodiments, the over-etching is adopted to make sure all the conductive traces to be properly patterned without inadvertent electrical connection. As can be seen in FIG. 14, top surface S11 is lower than bottom edge B2. Height H1 is greater than height H2 by around 100 to 200 angstroms. Source contact 181 and drain contact 191 are formed along with field plate 20. Top surface T20 of field plate and top surface T19 of drain contact 191 are protected by resist or hard mask 202 in FIG. 13 such that their heights over top surface S5 remains nearly the same at height H1. A thickness of field plate 20 and drain contact 191 are also substantially the same. Bottom edge B2 and bottom surface B3 are nearly the same at height H1 since they are protected from etching. A distance L25 between field plate 20 and gate structure 15 is controlled by patterning of resist or hard mask 202 near gate structure 15 in FIG. 13. In some embodiments, distance L25 is less than around 0.5 micrometers.

In FIG. 15, capping layer 14 is formed over source contact 181, passivation layer 11, field plate 20, and drain contact 191. In some embodiments, top surface of capping layer 14 follows a contour of field plate 20 or drain contact 191.

Figure 16:
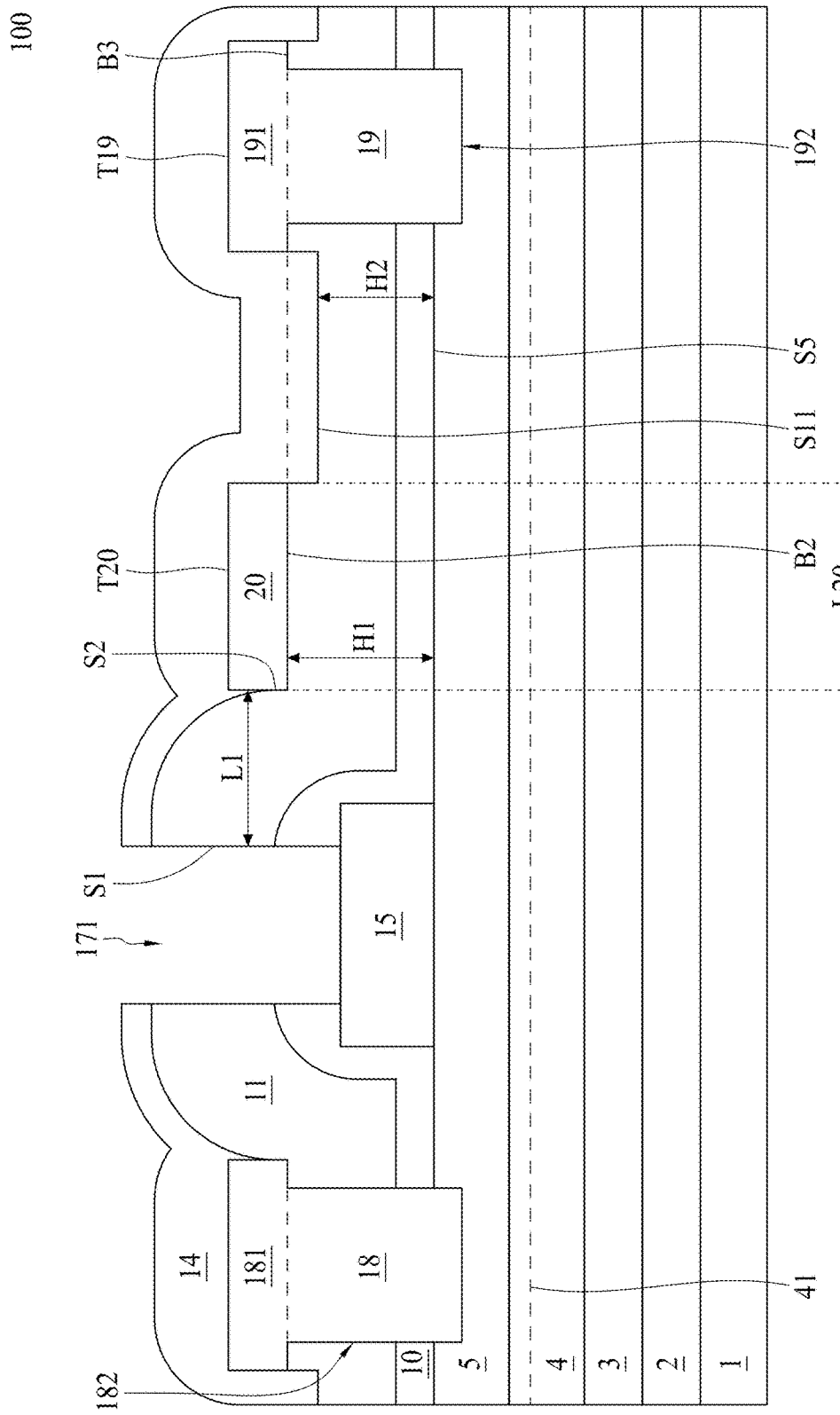

In FIG. 16, opening 171 is formed by any suitable operation such as dry etching. The dry etching removes portions of capping layer 14, passivation layer 11, and gate protection layer 10 over gate structure 15. A portion of gate structure 15 is exposed. The dry etching defines first edge S1 at horizontal distance L1 from second edge S2 of field plate 20. Horizontal distance L1 is controlled to be less than around 0.5 micrometers by any suitable lithographic operation including dry etching.

Figure 17:
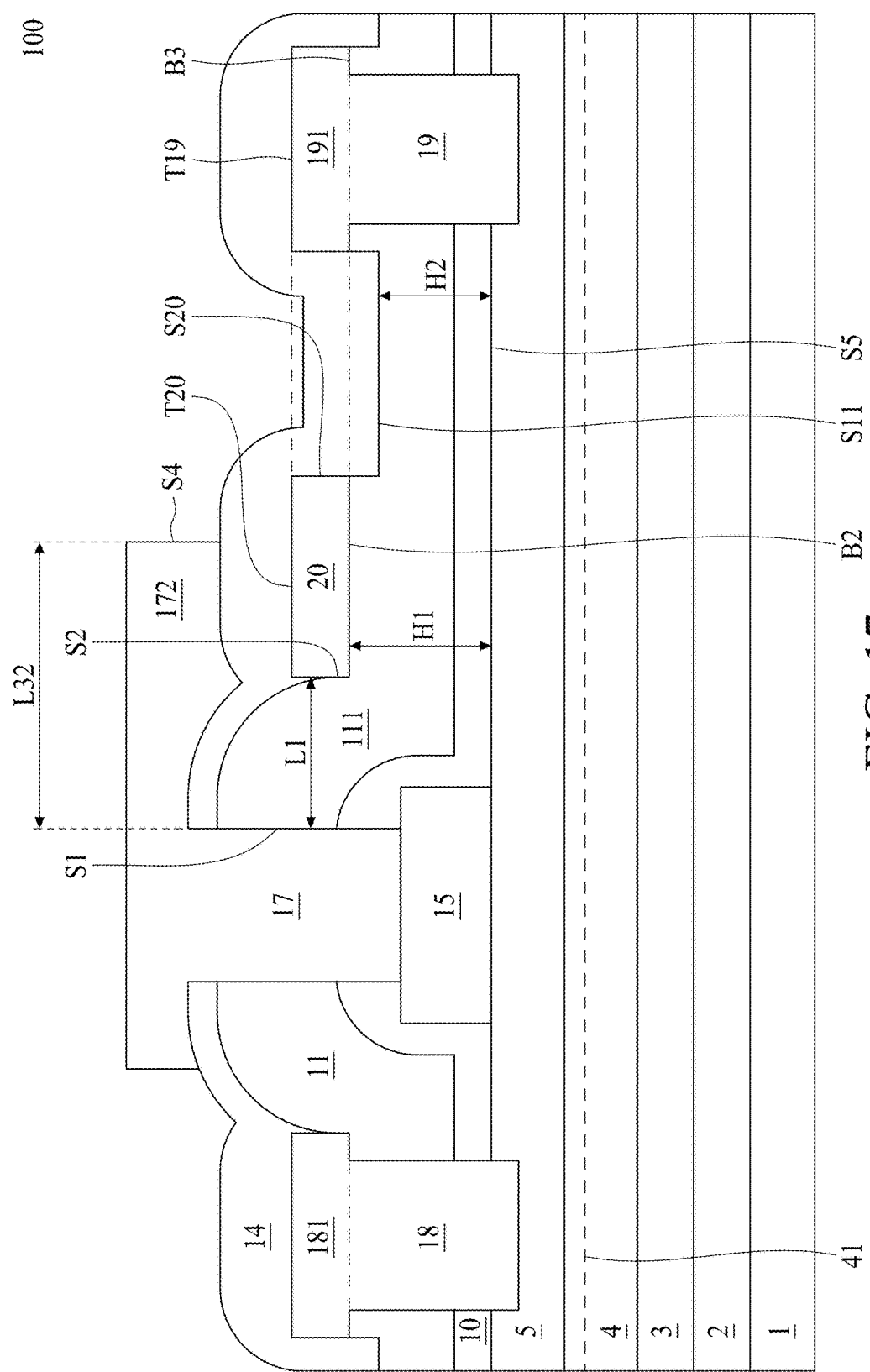

In FIG. 17, gate electrode 17 is formed. In some embodiments, a conductive material is blanket deposited over capping layer 14 and filling inside opening 171 to form gate electrode 17. The conductive material is patterned to include horizontal portion 172 over a portion of field plate 20. In some embodiments, a patterning operation defines far edge S4 of horizontal portion 172 of the gate electrode 17 extending from first edge S1 of gate electrode 17 by a length L32 at a range of from about 0.1 to about 2 micrometers. Horizontal portion 172 protects portion 111 of passivation layer 11 between gate electrode 17 and field plate 20.

Figure 18:
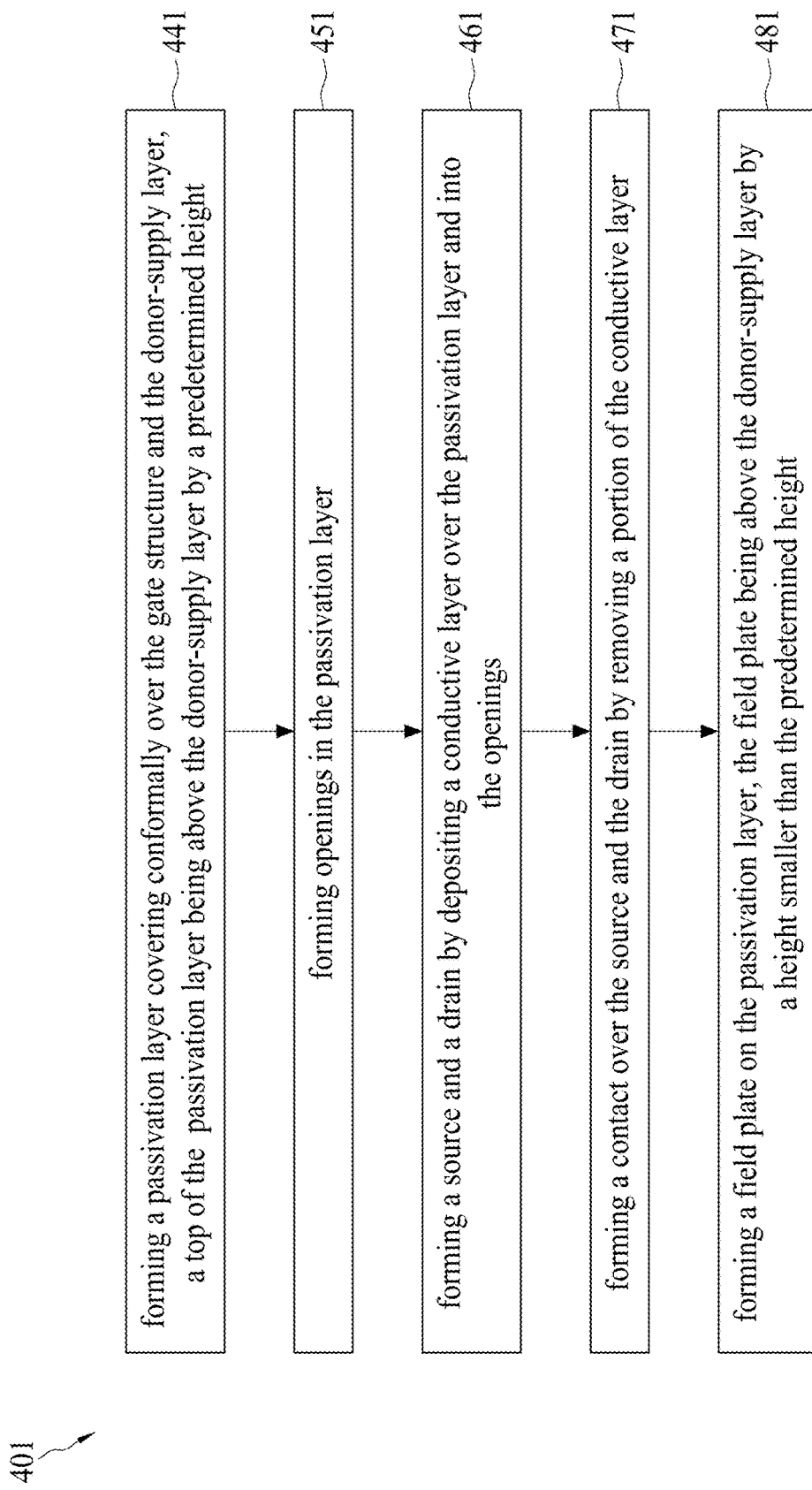
FIG. 18 is an operational flow of a method for manufacturing a semiconductor device, in accordance with some embodiments.
Figure 19A:
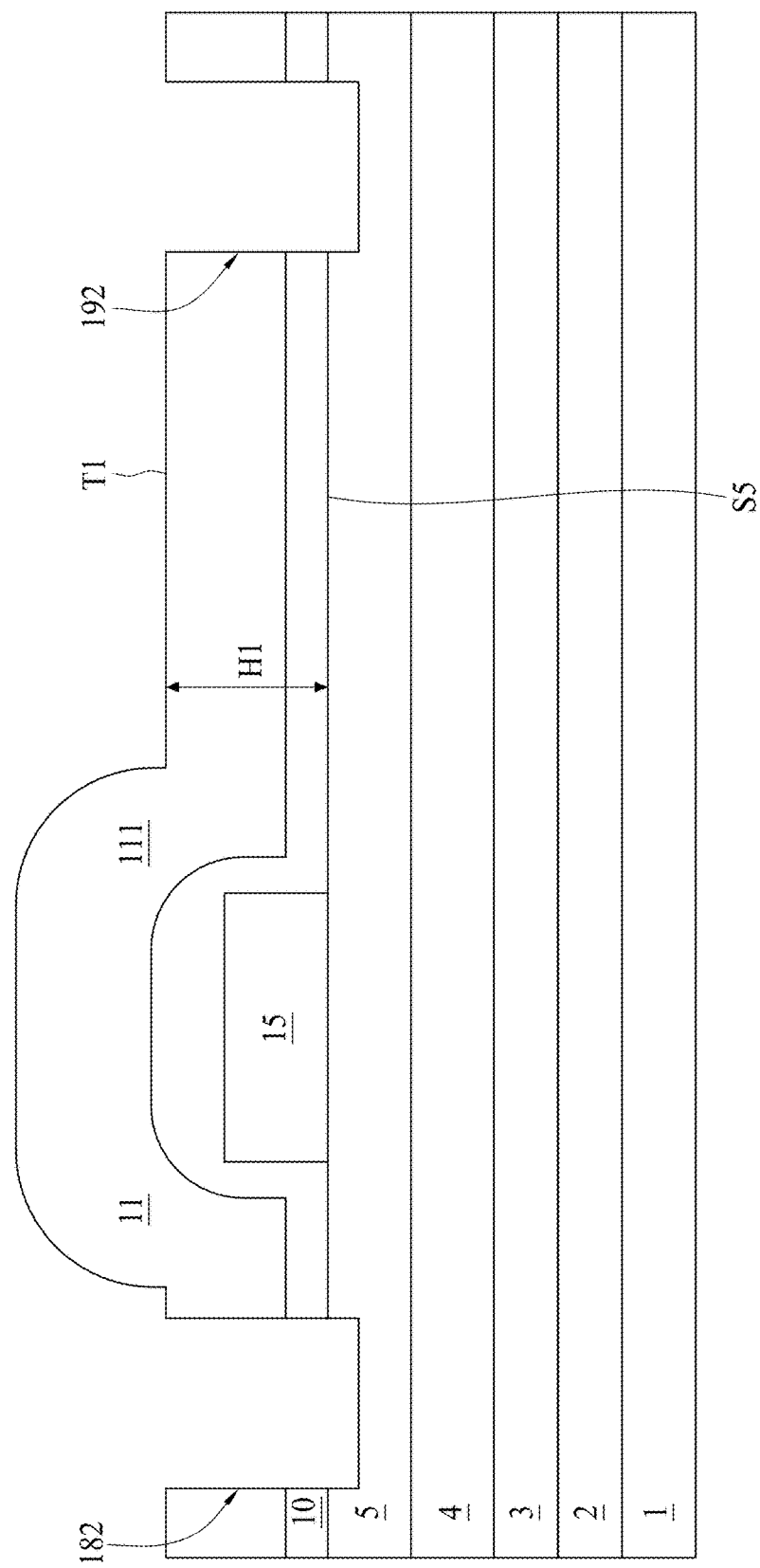
FIGS. 19A to 25 are fragmental cross-sectional views during operations of a method for manufacturing a semiconductor device, in accordance with some embodiments.
Figure 19B:
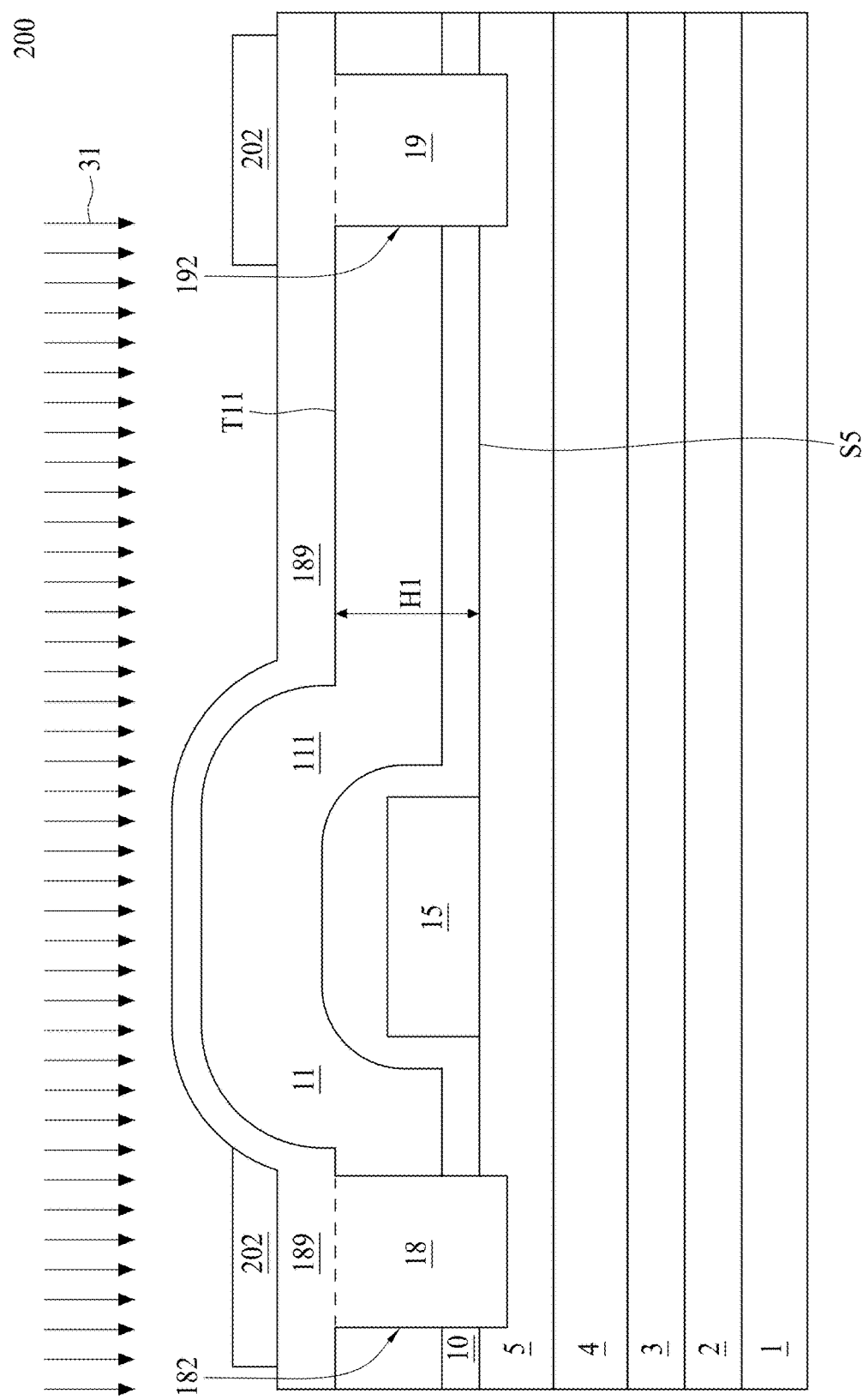
Figure 20:
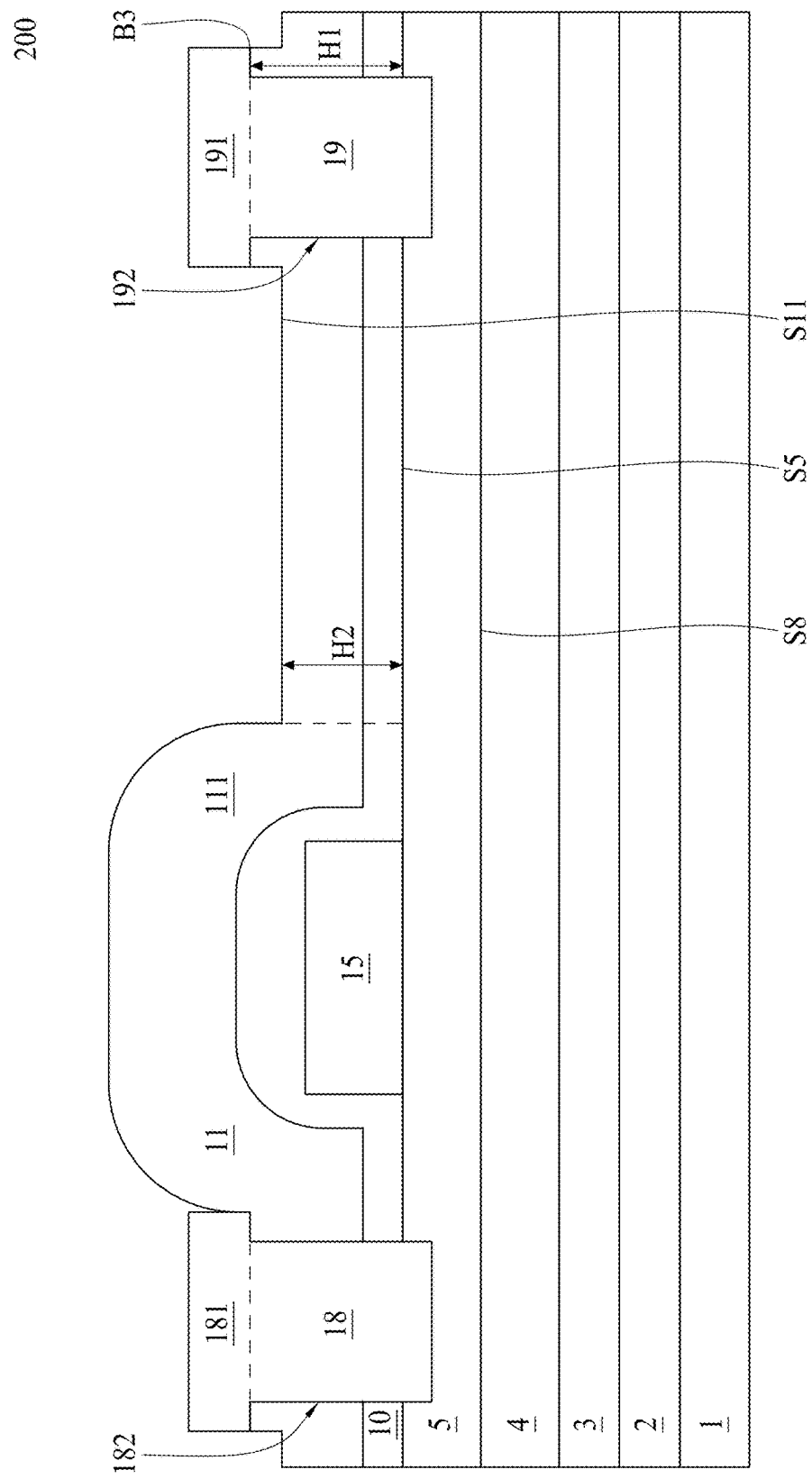

In FIG. 18, a method of manufacturing 401 is illustrated. FIG. 18 illustrates a process flow for forming the semiconductive device 200 in FIG. 2. In some embodiments, operation 441 can be subsequent to operation 430 of FIG. 7. Operation 441 forms a passivation layer 11 over the gate structure 15 and the donor-supply layer 5, a top of the passivation layer 11 such as top surface S11 (shown in FIG. 2) being above the donor-supply layer 5 by a predetermined height H1. Some exemplary embodiments for operation 441 are illustrated in FIG. 19A. Operation 451 forms openings 192, 182 in the passivation layer 11. Some exemplary embodiments for operation 451 are illustrated in FIG. 19A. Operation 461 forms a source 18 and a drain 19 by depositing a conductive layer 189 over the passivation layer 11 and into the openings 192, 182. Some exemplary embodiments for operation 461 are illustrated in FIG. 19B. Operation 471 forms a contact 191, 181 over the source 18 and the drain 19 by removing a portion of the conductive layer 189. Some exemplary embodiments for operation 471 are illustrated in FIGS. 19B and 20. Operation 481 forms a field plate 21 on the passivation layer 11, the field plate 21 being above the donor-supply layer 5 by a height H2 smaller than the predetermined height H1. Some exemplary embodiments for operation 481 are illustrated in FIG. 21.

In some embodiments, operation 471 can be referred to FIG. 19B and FIG. 20. Forming a contact 191, 181 is by forming resist or hard mask 202 over the conductive layer 189. The resist or hard mask 202 formation follows from operation 460 in FIG. 12B. The resist or hard mask 202 is patterned over portions of conductive layer 189 covering over source 18 and drain 19 but not near portion 111. In FIG. 19B, conductive layer 189 near portion 111 is exposed to etchants of the etching operation 31, while conductive layer 189 over source 18 or drain 19 is protected from the etching operation 31. In FIG. 20, the field plate does not form concurrently along with the formation of drain contact 191. Referring back to FIG. 13, field plate 20 is formed concurrently along with drain contact 191 in a single lithographic operation. In FIG. 21, field plate 21 is formed separately after the forming of the drain contact 191.

In FIG. 20, some exposed portions of conductive layer 189 are removed leaving source contact 181 and drain contact 191 remain over source 18 and drain 19. Bottom surface B3 of drain contact 191 is above top surface S5 by a height H1. A top portion of passivation layer 11 not covered by the source contact 181 and drain contact 191 is partially removed by the over-etching such that top surface S11 is lowered from height H1 to height H2.

Figure 21:
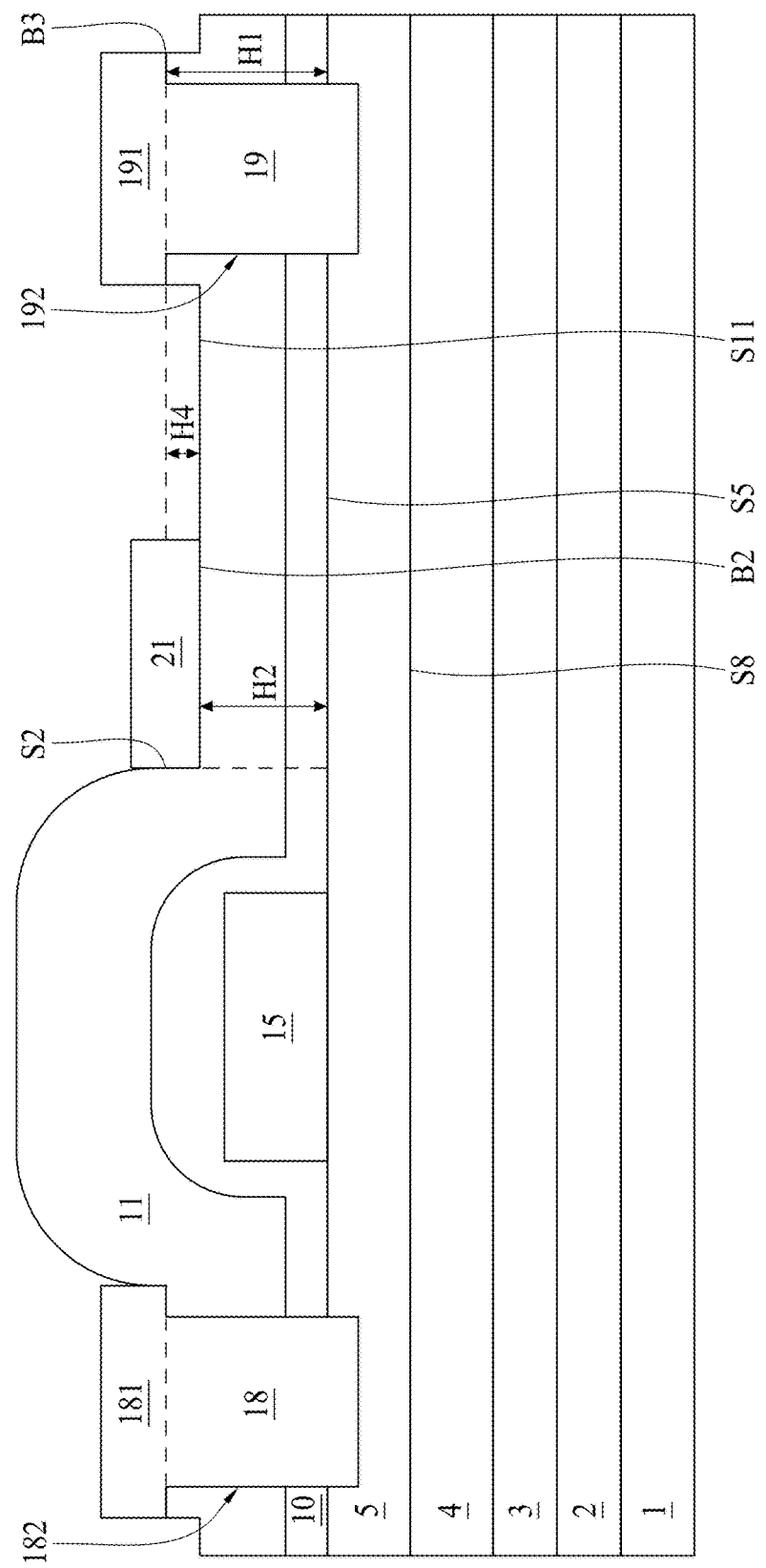

In FIG. 21, the field plate 21 is formed after removing the top portion of the passivation layer 11. Field plate 21 is formed on top of passivation layer 11 such that bottom edge B2 is over top surface S5 by the height H2. Field plate 21 may be formed by depositing a material different from that of drain contact 191 or the source contact 181 since field plate 21 is not formed by patterning the conductive layer 189 in FIG. 19B. Suitable material for the field plate includes titanium nitride, titanium, or aluminum copper. Bottom edge B2 of field plate 21 can be made lower than bottom surface B3 of drain contact 191 by a height H4 at around 100 to 200 angstroms. Lowering bottom edge B2 reduces the electric field near the top surface S5. A thickness of field plate 21 can be different from the thickness of the drain contact 191 or the source contact 181.

Figure 22:
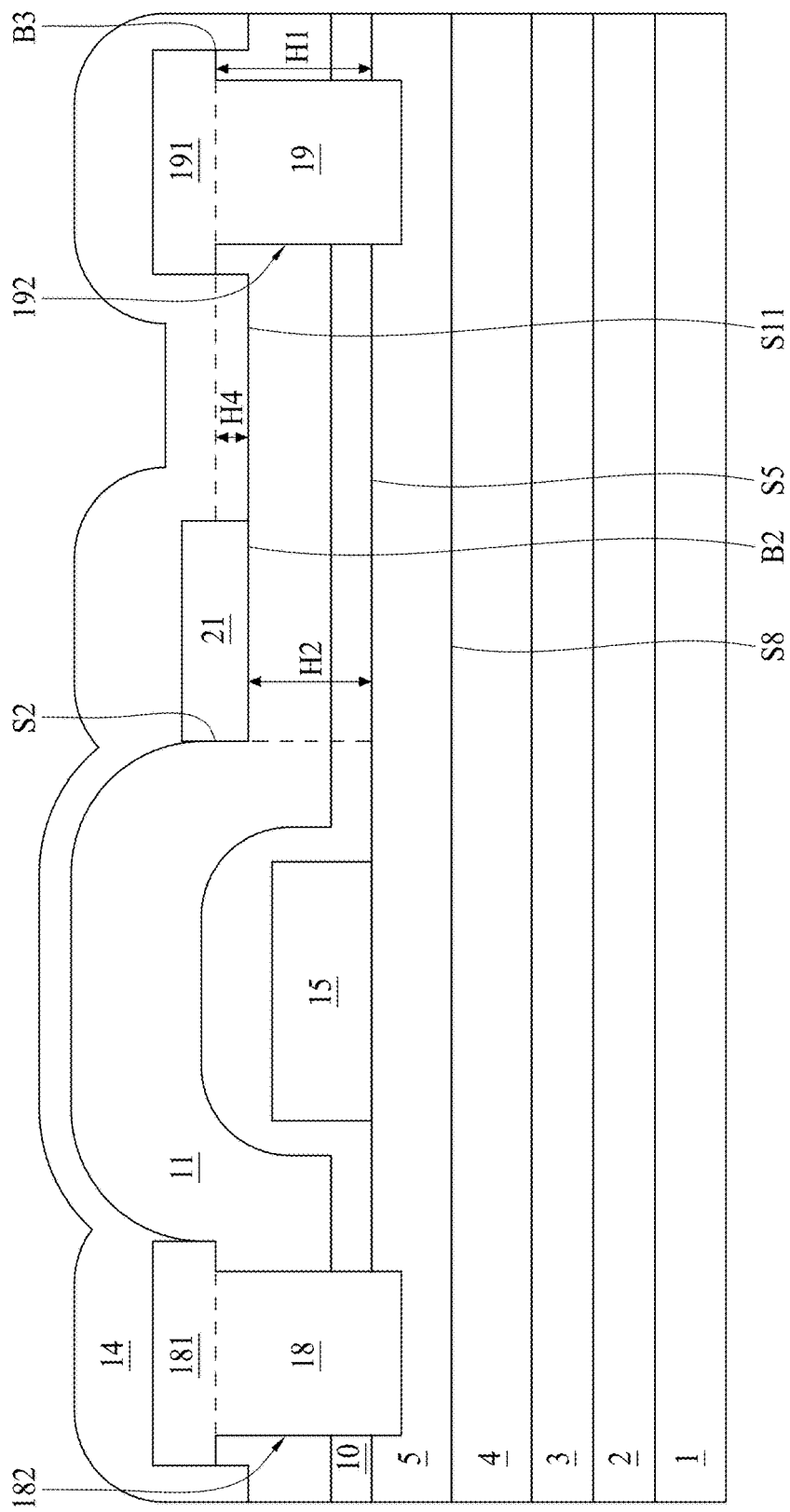
Figure 23:
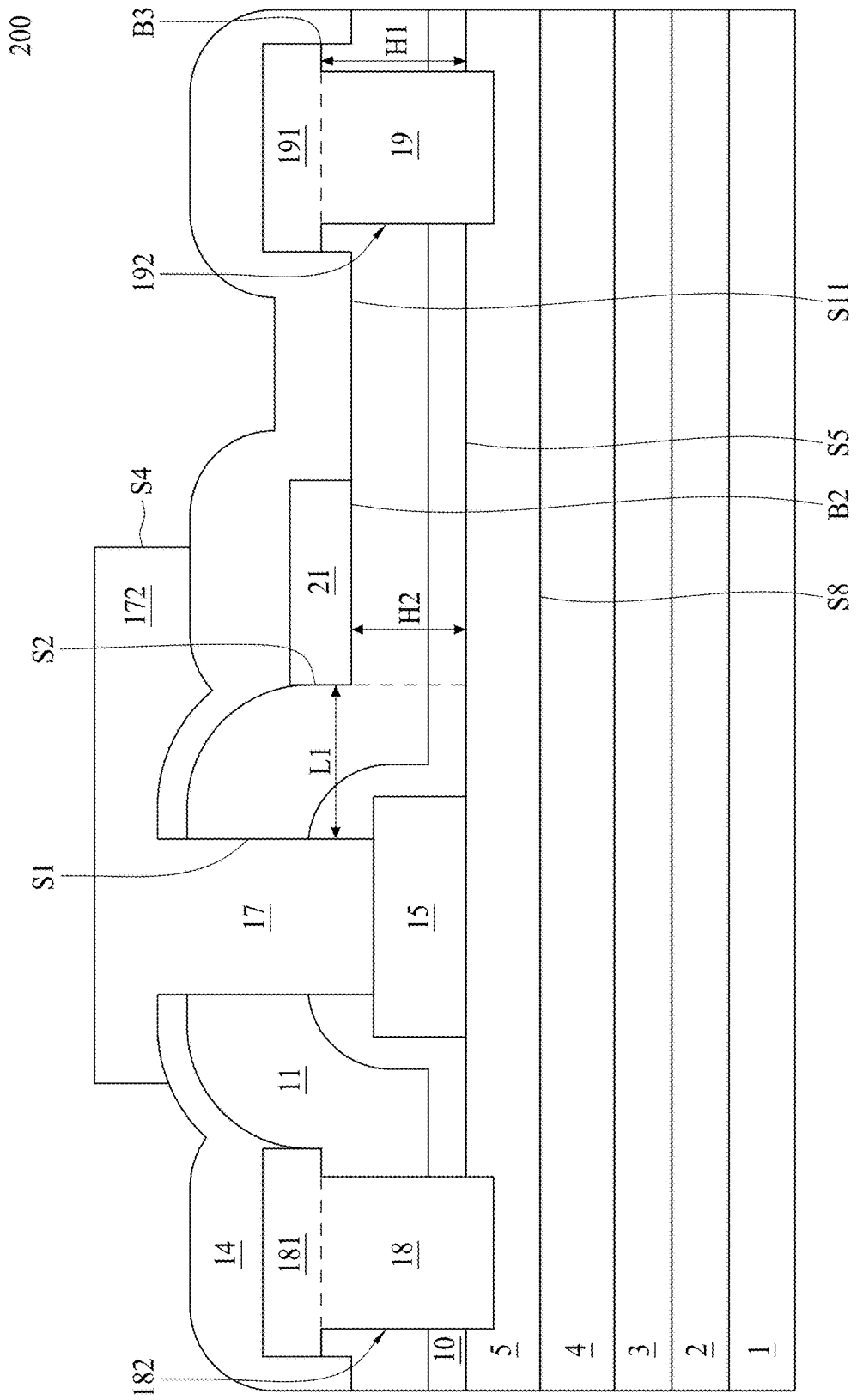

In FIG. 22, capping layer 14 is formed covering over field plate 21, over passivation layer 11, and over drain contact 191 similar to capping layer 14 in FIG. 15. In FIG. 23, gate electrode 17 and horizontal portion 172 thereof are formed by operation similar to operation illustrated in FIGS. 16, 17.

Figure 24:
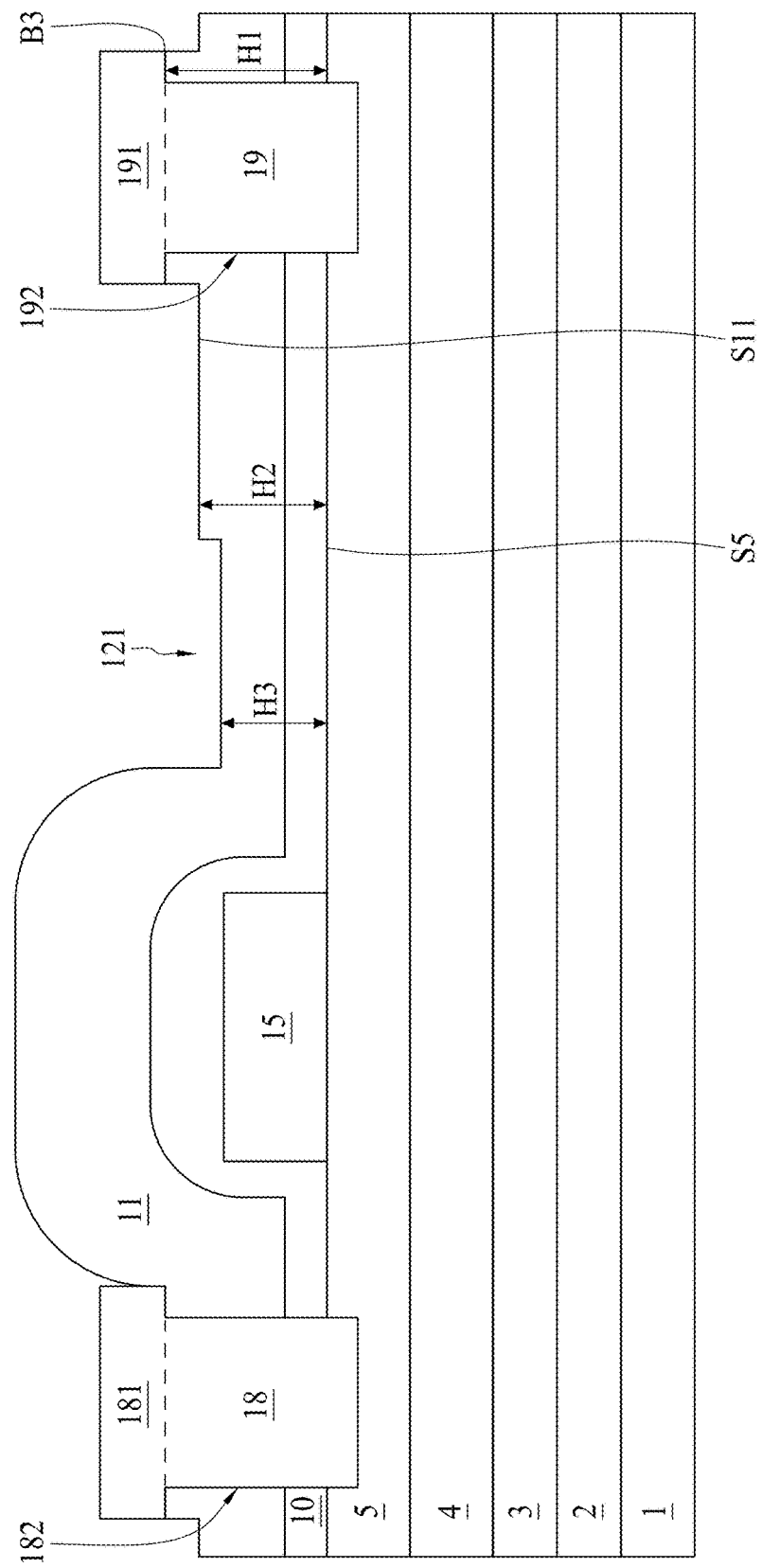
Figure 25:
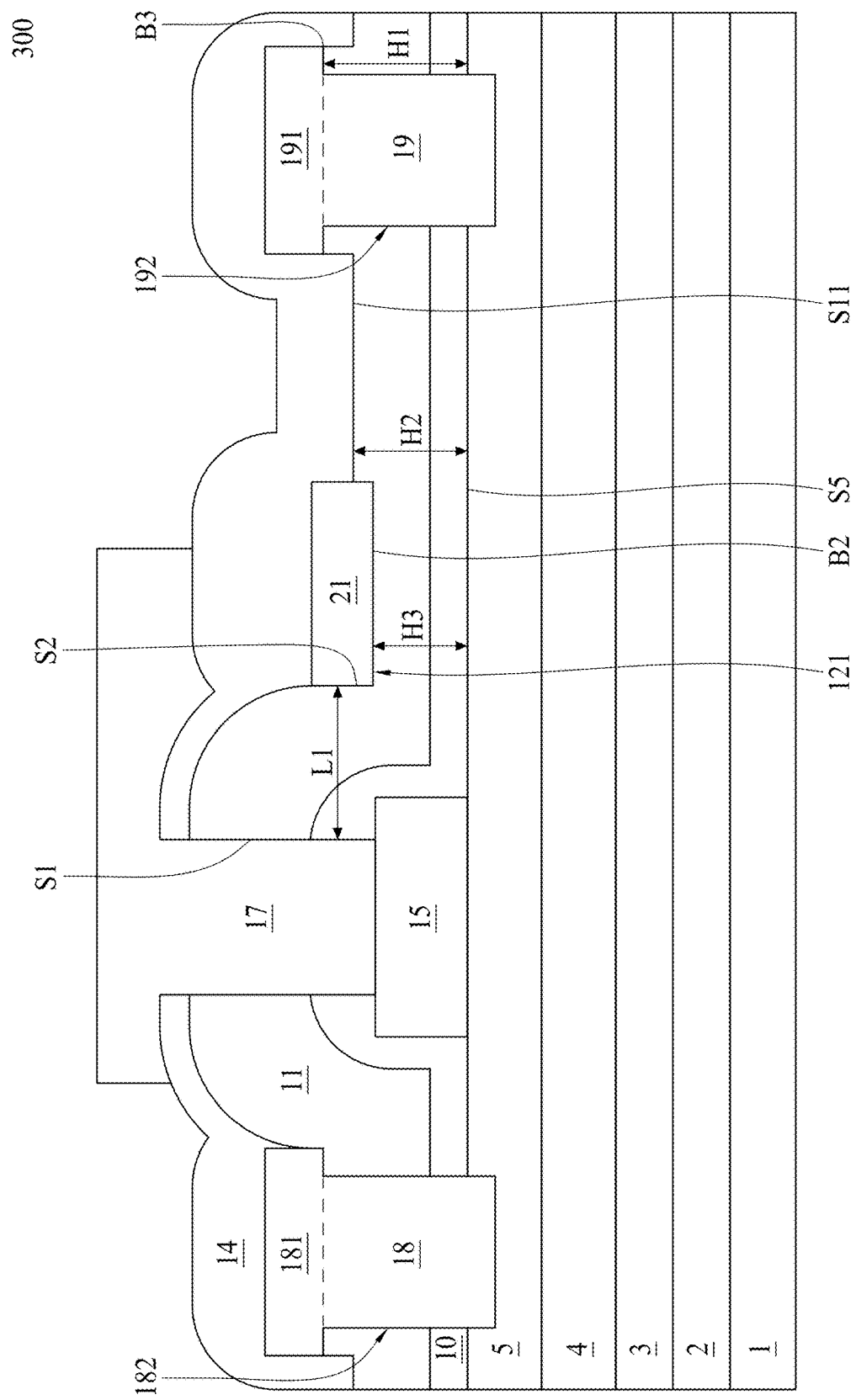

In some further embodiments, additional operations of further removing a top portion of passivation layer 11 in FIG. 24 can be followed subsequently after operation of forming drain contact 191 in FIG. 20. FIGS. 24, 25 illustrate the additional operations for forming the semiconductive device 300 in FIG. 3. In FIG. 24, the top surface of passivation layer 11 is etched to form a recess 121 such that a bottom of the recess 121 is over the top surface S5 by a height H3. Height H3 of the recess 121 is smaller than height H2 of top surface S11. Note the top surface S11 illustrated in FIG. 25 and FIG. 26 refers to a portion of the passivation layer 11 between the drain 19 and the field plate 21. Height H2 of top surface S11 is smaller than height H1 of bottom surface B3. Height H3 can be a design factor depending on how effective the field plate can reduce the gate edge electric field by positioning at a suitable distance away from the top surface S5. Hence, the original thickness of the passivation layer 11 is not a limiting factor to said suitable distance.

In FIG. 25, the field plate 21 is formed in the recess 121. Bottom edge B2 of field plate 21 is in contact with the bottom of recess 121 such that bottom edge B2 is lower than top surface S11. Capping layer 14 is formed by forming an oxide layer covering over the field plate 21 and the passivation layer 11. Capping layer 14 is formed over the gate structure 15. A portion of capping layer 14 is etched for the formation of gate electrode 17. The field plate 21 is formed to have a second edge S2. Gate electrode 17 is formed have a first edge S1 facing the second edge S2 of the field plate 21. The horizontal distance L1 from the first edge S1 to the second edge S1 is in a range of from about 0.05 to about 0.5 micrometers.

Some embodiments of the present disclosure provide a semiconductor device. The semiconductor device includes a semiconductive substrate. A donor-supply layer is over the semiconductive substrate. The donor-supply layer includes a top surface. A gate structure, a drain, and a source are over the donor-supply layer. A passivation layer over the gate structure and the donor-supply layer. A gate electrode is over the gate structure. A field plate is disposed on the passivation layer between the gate electrode and the drain. The field plate includes a bottom edge. The gate electrode having a first edge in proximity to the field plate, the field plate comprising a second edge facing the first edge, a horizontal distance between the first edge and the second edge is in a range of from about 0.05 to about 0.5 micrometers.

Some embodiments of the present disclosure provide a method for manufacturing a semiconductor device. The method includes providing a semiconductive substrate; forming a donor-supply layer over the semiconductive substrate; forming a gate structure over the donor-supply layer; forming a passivation layer over the gate structure and the donor-supply layer; forming openings in the passivation layer; forming a source and a drain by depositing a conductive layer over the passivation layer and within the openings; forming a field plate in proximity to the gate structure and forming a contact over the source and the drain by patterning the conductive layer; and forming a capping layer covering over the field plate.

Some embodiments of the present disclosure provide a method of manufacturing a semiconductor device. The method includes receiving a semiconductive substrate; forming a donor-supply layer over the semiconductive substrate; forming a gate structure over the donor-supply layer; forming a passivation layer over the gate structure and the donor-supply layer, a top surface of the passivation layer being above the donor-supply layer by a predetermined height; forming openings in the passivation layer; forming a source and a drain by depositing a conductive layer over the passivation layer and within the openings, and removing a portion of the conductive layer; forming a field plate on the passivation layer, the field plate being above the donor-supply layer by a height smaller than the predetermined height; and forming an oxide layer covering over the field plate and partially over the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductive substrate;
   a donor-supply layer over the semiconductive substrate, the donor-supply layer comprising a top surface;
   a gate structure, a drain, and a source over the donor-supply layer;
   a passivation layer over the gate structure and the donor-supply layer;
   a gate electrode over the gate structure;
   a field plate disposed on the passivation layer between the gate electrode and the drain, the field plate comprising a bottom edge; and
   wherein the gate electrode having a first edge in proximity to the field plate, the field plate comprising a second edge facing the first edge, a horizontal distance between the first edge and the second edge is in a range of from about 0.05 to about 0.5 micrometers.

2. The semiconductor device of claim 1, further comprising a capping layer over the field plate.

3. The semiconductor device of claim 1, further comprising a contact over the source or the drain, the contact comprising a bottom surface substantially coplanar with the bottom edge of the field plate.

4. The semiconductor device of claim 1, wherein a vertical distance between the bottom edge and the top surface is about 100 angstroms.

5. The semiconductor device of claim 1, wherein the source or the drain comprises an identical material as the field plate.

6. The semiconductor device of claim 1, further comprising a contact over the source or the drain, a bottom surface of the contact being substantially higher than the bottom edge of the field plate, the bottom edge of the field plate being substantially coplanar with a top surface of the passivation layer.

7. The semiconductor device of claim 1, wherein the bottom edge of the field plate is substantially lower than a top surface of the passivation layer.

8. The semiconductor device of claim 1, wherein the gate electrode comprises a horizontal portion over the capping layer and extending over the field plate.

9. A method of manufacturing a semiconductor device, comprising:
   providing a semiconductive substrate;
   forming a donor-supply layer over the semiconductive substrate;
   forming a gate structure over the donor-supply layer;
   forming a passivation layer over the gate structure and the donor-supply layer;
   forming openings in the passivation layer;
   forming a source and a drain by depositing a conductive layer over the passivation layer and within the openings;
   forming a field plate in proximity to the gate structure and forming a contact over the source and the drain by patterning the conductive layer; and
   forming a capping layer covering over the field plate.

10. The method of claim 9, further comprising forming a gate electrode over the gate structure, the gate electrode comprising a horizontal portion over the capping layer and extending over the field plate.

11. The method of claim 9, wherein the forming the field plate comprises forming a bottom edge of the field plate over a top surface of the donor-supply layer by a vertical distance of around 100 angstroms.

12. The method of claim 9, further comprising forming a gate electrode over the gate structure, the gate electrode comprising a first edge and wherein the forming the field plate comprises forming a second edge of the field plate facing the first edge, and the first edge being away from the second edge by a horizontal distance of in a range of from about 0.05 to about 0.5 micrometers.

13. The method of claim 9, wherein the forming the field plate comprises removing a portion of the passivation layer such that a top surface of the passivation layer is lower than a bottom edge of the field plate.

14. The method of claim 9, wherein the forming the field plate and the forming the contact is by patterning the conductive layer such that a top surface of the field plate and a top surface of the contact are substantially coplanar.

15. A method of manufacturing a semiconductor device comprising:
   receiving a semiconductive substrate;
   forming a donor-supply layer over the semiconductive substrate;
   forming a gate structure over the donor-supply layer;
   forming a passivation layer over the gate structure and the donor-supply layer, a top surface of the passivation layer being above the donor-supply layer by a predetermined height;
   forming openings in the passivation layer;
   forming a source and a drain by depositing a conductive layer over the passivation layer and within the openings, and removing a portion of the conductive layer;
   forming a field plate on the passivation layer, the field plate being above the donor-supply layer by a height smaller than the predetermined height; and
   forming an oxide layer covering over the field plate and partially over the gate structure.

16. The method of claim 15, wherein the forming the field plate further comprises over-etching a top portion of the passivation layer after removing the portion of the conductive layer, and forming the field plate after removing the top portion of the passivation layer.

17. The method of claim 16, wherein the removing the top portion of the passivation layer comprises lowering the passivation layer by a range from around 100 to around 200 angstroms.

18. The method of claim 15, further comprising forming a gate electrode over the gate structure, the gate electrode comprising a first edge facing the field plate, the forming the field plate comprising forming a second edge of the field plate facing the first edge, wherein a horizontal distance between the second edge and the first edge is in a range of from about 0.05 to about 0.5 micrometers.

19. The method of claim 15, wherein the forming the field plate comprises forming a bottom edge of the field plate closer to a top surface of the donor-supply layer than a top surface of a portion of the passivation layer between the drain and the field plate.

20. The method of claim 15, wherein the forming the field plate comprises depositing conductive material different from a material of the conductive layer, the conductive material comprising titanium nitride, titanium, or aluminum copper.

* * * * *